(12) United States Patent
Izuha et al.

(10) Patent No.: US 6,440,616 B1
(45) Date of Patent: Aug. 27, 2002

(54) MASK AND METHOD FOR FOCUS MONITORING

(75) Inventors: Kyoko Izuha, Yokohama; Tadahito Fujisawa, Tokyo; Soichi Inoue, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 43 days.

(21) Appl. No.: 09/671,501

(22) Filed: Sep. 27, 2000

(30) Foreign Application Priority Data

Sep. 28, 1999 (JP) .......................... 11-274701
Dec. 28, 1999 (JP) .......................... 11-375472

(51) Int. Cl.⁷ ............................... G03F 9/00
(52) U.S. Cl. ............................. 430/5; 430/22
(58) Field of Search .................. 430/5, 22, 322; 356/399, 401

(56) References Cited

U.S. PATENT DOCUMENTS 5,300,786 A   4/1994  Brunner et al. ............ 250/548
6,057,908 A * 5/2000  Ota ............................ 355/55

FOREIGN PATENT DOCUMENTS

JP   10-335208   12/1998
JP   11-102061    4/1999

* cited by examiner

Primary Examiner—S. Rosasco
(74) Attorney, Agent, or Firm—Finnegan, Henderson, Farabow, Garrett, & Dunner, L.L.P.

(57) ABSTRACT

There is disclosed a focus-monitoring mask which is adapted to be employed on an occasion of transferring a pattern on a wafer by way of photolithography, the mask comprising a first pattern region having at least one first monitor pattern which is constituted by a first opening surrounded by a first film or constituted by the first film surrounded by the first opening, and a second pattern region having at least one second monitor pattern which is constituted by a second opening surrounded by a second film or constituted by the second film surrounded by the second opening, and is capable of giving a predetermined phase difference to an exposure light passing through the second film relative to an exposure light passing through the second opening, wherein the first and second monitor patterns have a configuration in which both ends thereof are tapered from a central portion thereof.

26 Claims, 23 Drawing Sheets

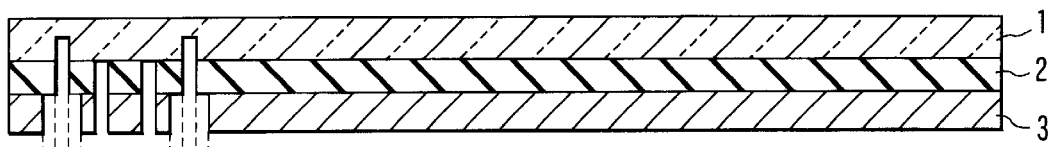
FIG. 18A
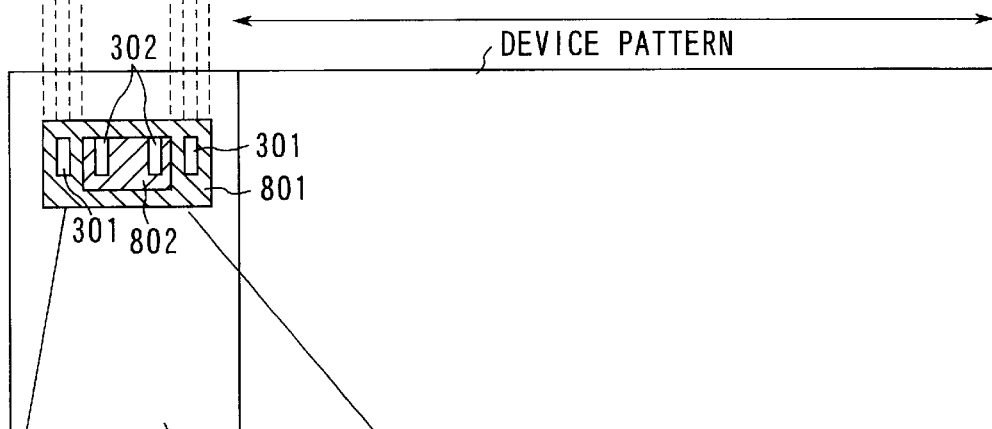
FIG. 18B
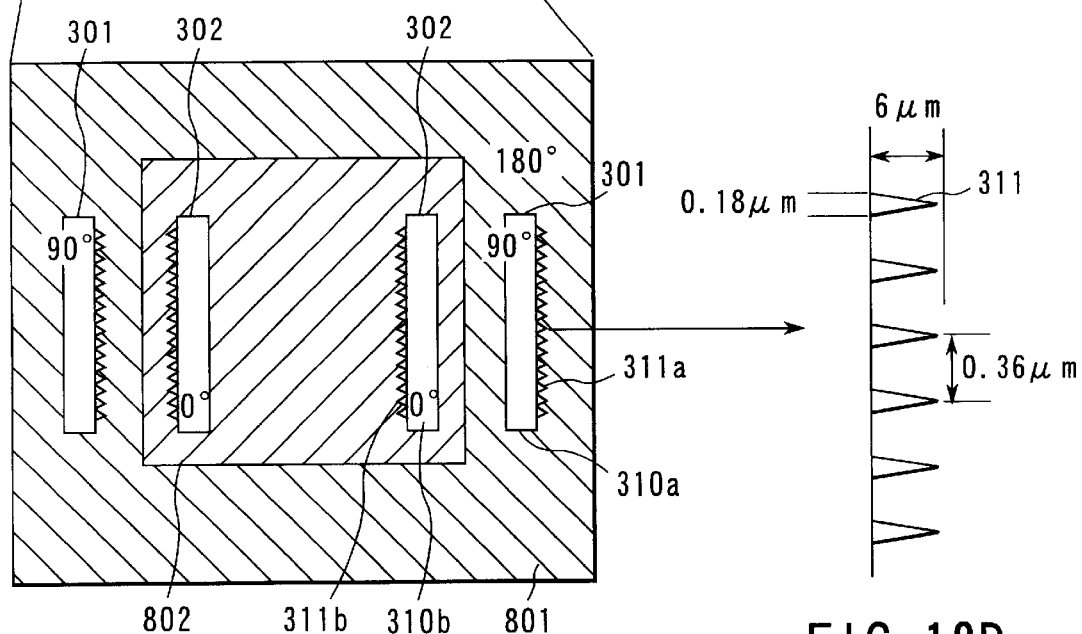
FIG. 18C
FIG. 18D

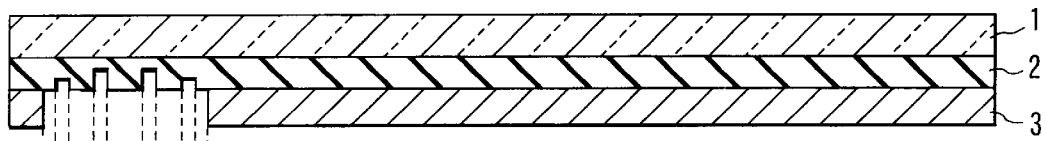
FIG. 29A
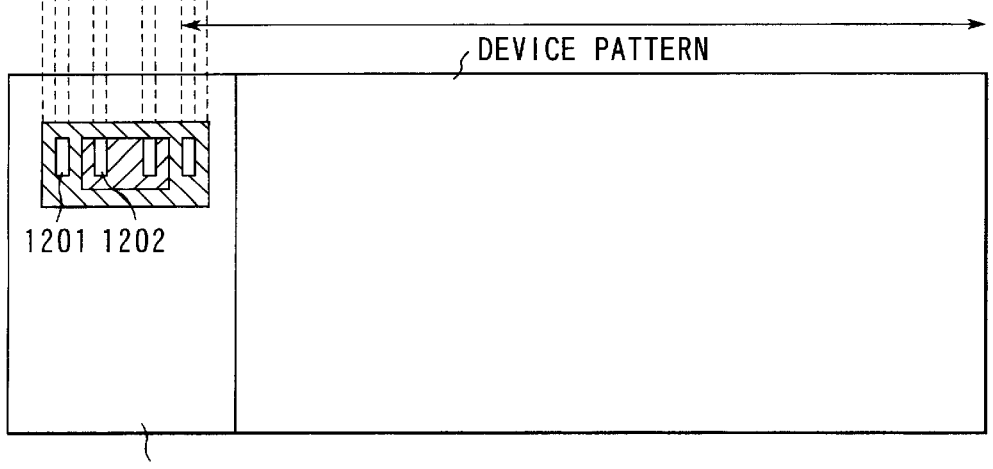
FIG. 29B
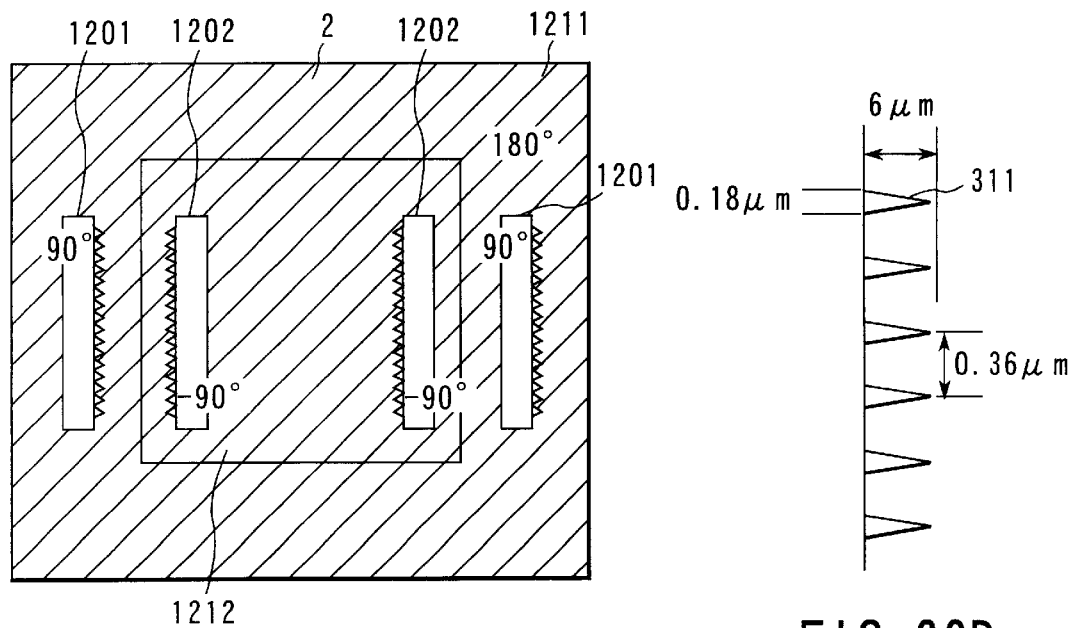
FIG. 29C
FIG. 29D

MASK AND METHOD FOR FOCUS MONITORING

CROSS-REFERENCE TO RELATED APPLICATIONS

This application is based upon and claims the benefit of priority from the prior Japanese Patent Applications No. 11-274701, filed Sep. 28, 1999; and No. 11-375472, filed Dec. 28, 1999, the entire contents of which are incorporated herein by reference.

BACKGROUND OF THE INVENTION

The present invention relates to a focus-monitoring mask and a method for focus monitoring, which are suited for use in setting a focus condition of a projection aligner on the occasion of manufacturing a semiconductor device or a liquid crystal display device, etc.

As a minimum line width of ULSI pattern is approaching the resolution limit in optical microlithography, it is now becoming very difficult to sufficiently secure a process margin such as exposure latitude and the depth of focus. Therefore, it is now required to develop a technique for monitoring the dose of exposure and the focus of exposure light for the purpose of effectively utilizing a small margin available as well as for the purpose of preventing the deterioration of yield.

According to the conventional method of monitoring the focus, the focus is determined in such a way that an exposure is performed onto a QC mask having a rhomboid mark as shown in FIG. 1A while changing the defocus thereof, and when the length L of pattern of the rhomboid mark (FIG. 1B) that has been transferred on the surface of wafer becomes the largest, the focus point giving the largest length L is assumed as being a best focus value. In this case, the relationship between the length L of the pattern and the defocus can be represented as shown in FIG. 2 (Japanese Patent Unexamined Publication H10-335208).

When the pattern is transferred with this best focus, very fine details of the rhomboid mark can be resolved. Whereas as the focus goes out of this best focus, such fine details can no more be resolved. Therefore, the length L of pattern of the rhomboid mark transferred on the surface of wafer would become the largest at this best focus point, the length L of the pattern symmetrically decreasing gradually on both sides of the best focus point, i.e. plus and minus defocus sides. This method of utilizing the mark can be applied to a situation wherein an exposure is performed while changing the defocus of mark so as to determine the best focus before each lot is placed into processing steps thereof.

This conventional method however is accompanied with the following problems. Namely, if the condition of focus for each lot being subjected to an exposure under the same exposure condition is to be managed by making use of the rhomboid mark, there will be raised the problems that (1) the direction of defocus cannot be determined, and (2) the focusing is influenced by the fluctuation in quantity of exposure, if the best focus is to be determined only through the monitoring of the length L of the projected pattern of the rhomboid mark.

As an alternative method for focus monitoring, there has been proposed a method wherein the magnitude of fluctuation of focus is detected, without being influenced by the quantity of exposure, as a magnitude of dislocation of pattern (U.S. Pat. No. 5,300,786). The sensitivity of detecting a focus by making use of a mark according to this method depends largely on the configuration of light source (coherence factor σ), so that there is a problem that even though it may be possible to obtain a sufficient sensitivity under an exposure condition where the value of σ is relatively low, it is impossible to obtain a sufficient sensitivity under an exposure condition where the value of σ is relatively large or under an annular exposure condition as is conventionally employed.

As another conventional method of monitoring the focus, a method of employing a QC mask having a mark as shown in FIG. 3A is known (Japanese Patent Unexamined Publication H11-102061). This mark is featured in that a central light-shielding portion 20 is disposed inside the peripheral light-shielding portion 10. Each of four sides of the central light-shielding portion 20 is formed into a saw-tooth configuration consisting of a plurality of fine wedge-like fine projections 22 and 24, the saw-tooth configurations formed on opposite sides (right and left sides, of top and bottom sides) are made asymmetrical with each other. In this case, an exposure to this mask is performed while changing the defocus, and when the magnitude of dislocation (L=S2−S1) of pattern of the pattern (FIG. 3B) that has been transferred on the surface of wafer becomes the minimum, the focus point giving this minimum value is assumed as being a best focus value.

The relationship between the magnitude of dislocation L of pattern and the defocus in this case can be represented as shown in FIG. 4. The magnitude of dislocation L changes almost symmetrically with respect to the defocus. However, when the focus is to be monitored by means of lotlink after arranging the aforementioned pattern over the dicing region of device mask, the exposure on the occasion of processing each lot is performed with a constant value without changing the set value of focus, so that the value of focus is determined through the conversion of the magnitude of dislocation L of the mark. In this case however, there is a problem that it is difficult to know the sign (+ or −) of the focus.

Relative to this, there has been also proposed a modified method in Japanese Patent Unexamined Publication H11-102061 (Watanabe et al) wherein the substrate for transferring a mark is modified as shown in FIG. 5. Namely, the substrate is partitioned as shown in FIG. 5 into regions 30 and regions 40, the elevations of which are differentiated from the other. By constructing the substrate in this manner, a difference or step is caused to generate between the magnitude of dislocation in X direction (σSx) and the magnitude of dislocation in Y direction (σSy) in the transferred pattern of mask as shown in FIG. 6. Therefore, when this difference between this couple of dislocations is plotted relative to the defocus (FIG. 7), the magnitude of dislocation of focus can be monitored together with the sign thereof. Since it is possible in this method to monitor the magnitude of dislocation of focus together with the sign thereof, it is possible to control the focus by means of lotlink. However, in the prevailing technique of today where CMP process is frequently employed, the method of forming a step in the substrate does not seem to be practical.

As explained above, the method of employing a rhomboid mark for monitoring the focus is certainly effective in detecting the magnitude of defocus from the best focus, but is defective in that the direction of defocus cannot be determined. Further, a method of detecting a magnitude of fluctuation of focus as a magnitude of defocus of pattern is accompanied with a problem that it is impossible to obtain a sufficient sensitivity under an exposure condition where the value of σ is relatively large or under an annular exposure condition.

Furthermore, the aforementioned method of forming a difference in level in the substrate for the purpose of measuring the deviation of focus together with the sign thereof is defective in that the steps of process would be increased, and is not practical since CMP process is employed in the manufacturing process.

BRIEF SUMMARY OF THE INVENTION

Therefore, an object of the present invention is to provide a focus-monitoring mask which is capable of very precisely and easily detecting the magnitude as well as direction of defocus from the best focus, thereby making it possible to improve the exposure precision.

Another object of the present invention is to provide a method for focus monitoring which is capable of very precisely and easily detecting the magnitude as well as direction of defocus from the best focus, thereby making it possible to improve the exposure precision.

Namely, according to the present invention, there is provided a focus-monitoring mask which is adapted to be employed on an occasion of transferring a pattern on a wafer by way of photolithography, the mask comprising;

a first pattern region having at least one first monitor pattern which is constituted by a first opening surrounded by a first film or constituted by the first film surrounded by the first opening; and a second pattern region having at least one second monitor pattern which is constituted by a second opening surrounded by a second film or constituted by the second film surrounded by the second opening, and is capable of giving a predetermined phase difference to an exposure light passing through the second film relative to an exposure light passing through the second opening;

wherein the first and second monitor patterns have a configuration in which both ends thereof are tapered from a central portion thereof.

Further, according to the present invention, there is provided a method for focus monitoring which is designed to monitor a magnitude of defocus state on an occasion of transferring a pattern on a wafer by way of photolithography, the method comprising the steps of;

transferring a pattern on a wafer by making use of the aforementioned focus-monitoring mask;

measuring the sizes of the first and second monitor patterns among the patterns formed on the wafer; and calculating, on the basis of the sizes measured, a difference or ratio between the size of the first monitor pattern and the size of the second monitor pattern.

According to the present invention, there is also provided a focus-monitoring mask which is adapted to be employed on an occasion of transferring a pattern on a wafer by way of photolithography, the mask comprising;

a first pattern region having at least one first monitor pattern which is constituted by a first opening surrounded by a first film or constituted by the first film surrounded by the first opening, and is capable of giving a predetermined phase difference to an exposure light passing through the first film relative to an exposure light passing through the first opening; and a second pattern region having at least one second monitor pattern which is constituted by a second opening surrounded by a second film or constituted by the second film surrounded by the second opening, and is capable of giving a predetermined phase difference to an exposure light passing through the second film relative to an exposure light passing through the second opening, the predetermined phase difference being different from that of the first pattern region;

wherein the first and second monitor patterns have a configuration in which both ends thereof are unidirectionally tapered from a central portion thereof.

Further, according to the present invention, there is provided a method for focus monitoring which is designed to monitor a magnitude of defocus state on an occasion of transferring a pattern on a wafer by way of photolithography, the method comprising the steps of;

transferring a pattern on a wafer by making use of the aforementioned focus-monitoring mask;

measuring the sizes of the first and second monitor patterns among the patterns formed on the wafer; and calculating, on the basis of the sizes measured, a difference or ratio between the size of the first monitor pattern and the size of the second monitor pattern.

According to the present invention, there is provided a focus-monitoring mask which comprises;

a first pattern region having at least one first tapered monitor pattern which is constituted by a first film surrounded by a first opening or constituted by the first opening surrounded by the first film; and a second pattern region having at least one second tapered monitor pattern which is constituted by a second opening surrounded by a second film or constituted by the second film surrounded by the second opening, the second tapered monitor pattern tapering in a direction which is opposite to the tapering direction of the first tapered monitor pattern;

wherein a phase of exposure light passing through the second monitor pattern differs from the phase of exposure light passing through the first monitor pattern.

Further, according to the present invention, there is also provided a method for focus monitoring which is designed to monitor a magnitude of defocus state on an occasion of transferring a pattern on a wafer by way of photolithography, the method comprising the steps of;

transferring a pattern on a wafer by making use of a focus-monitoring mask which comprises a first pattern region having at least one first tapered monitor pattern which is constituted by a first film surrounded by a first opening or constituted by the first opening surrounded by the first film; and a second pattern region having at least one second tapered monitor pattern which is constituted by a second opening surrounded by a second film or constituted by the second film surrounded by the second opening, the second tapered monitor pattern tapering in a direction which is opposite to the tapering direction of the first tapered monitor pattern; wherein a phase of exposure light passing through the second monitor pattern differs from the phase of exposure light passing through the first monitor pattern;

measuring the relative position between the first and second monitor patterns among the patterns formed on the wafer; and calculating, on the basis of the relative position measured, a deviation of the relative position of focus.

Further, according to the present invention, there is also provided a method for focus monitoring which is designed to monitor a magnitude of defocus state on an occasion of transferring a pattern on a wafer by way of photolithography, the method comprising the steps of;

transferring a pattern on a wafer by making use of a focus-monitoring mask having four groups of focus monitor pattern each group of focus monitor pattern comprising a first pattern region having at least one first tapered monitor pattern which is constituted by a first film surrounded by a first opening or constituted by the first opening surrounded by the first film; and a second pattern region having at least one second tapered monitor pattern which is constituted by a second opening surrounded by a second film or constituted by the second film surrounded by the second opening, the second tapered monitor pattern tapering in a direction which is opposite to the tapering direction of the first tapered monitor pattern; wherein a phase of exposure light passing through the second tapered monitor pattern differs from the phase of exposure light passing through the first tapered monitor pattern, and the four groups of focus monitor pattern are designed such that the direction of distal end of the tapered pattern is set to an angle of 0 degree, +45 degrees, −45 degrees and 90 degrees, respectively;

measuring the relative position between the monitor patterns of the first and second pattern regions among the patterns formed on the wafer; and correcting, on the basis of the relative position measured, a deviation of focus that is resulted from an aberration of irradiation optical lens.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 18A, 18B, 18C and 18D schematically illustrates the constructions of the focus-monitoring mask and focus monitor pattern according to the present invention;

FIGS. 29A, 29B, 29C and 29D schematically illustrates the constructions of the focus-monitoring mask and focus monitor pattern according to a fourth example;

DETAILED DESCRIPTION OF THE INVENTION

Figure 1A:
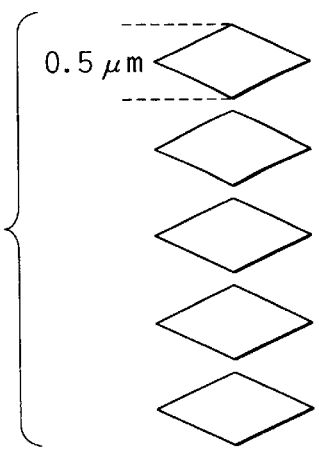
FIGS. 1A and 1B show a QC mask having a rhomboid mark and a rhomboid pattern to be formed on a wafer, explaining the conventional method for monitoring the determination of focus.
Figure 1B:
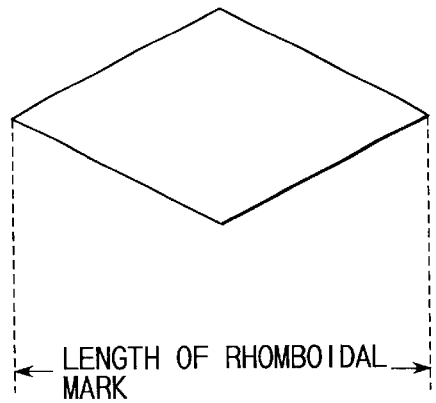
Figure 2:
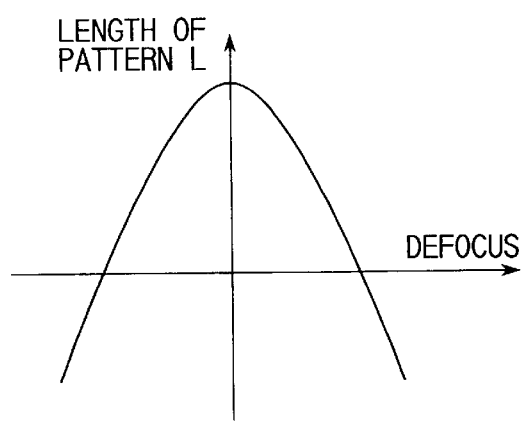
FIG. 2 is a graph explaining the relationship between the length L of pattern and defocus.
Figure 4:
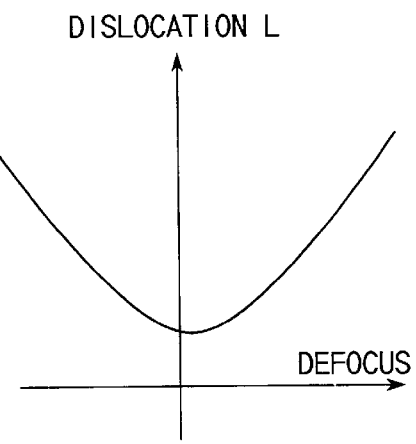
FIG. 4 is a graph explaining the relationship between the magnitude of dislocation of focus monitor pattern and defocus according to the prior art.
Figure 5:
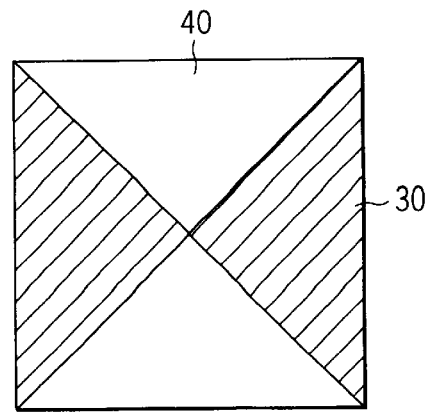
FIG. 5 is a plan view schematically illustrating the improvement that has been made on a substrate for the purpose of performing a focus monitoring.
Figure 3A:
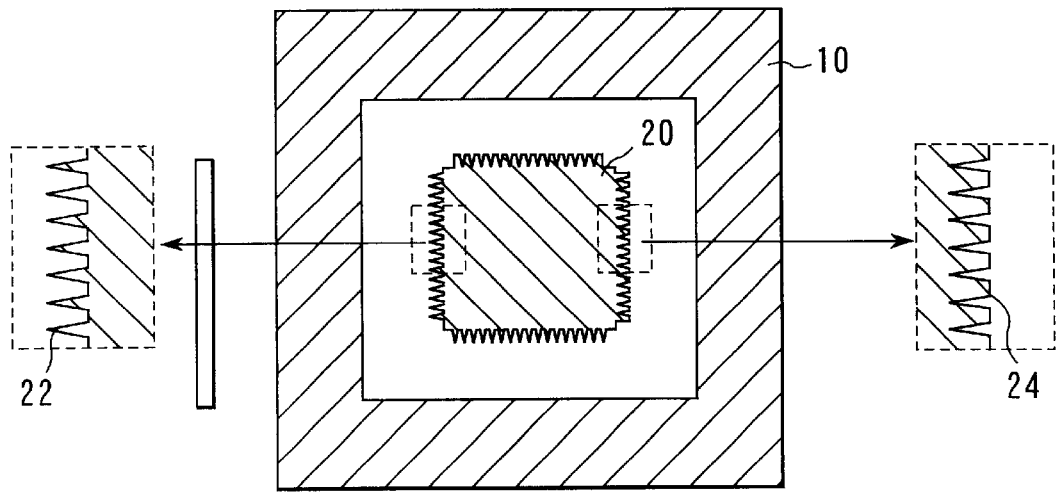
FIGS. 3A and 3B show plan views illustrating a focus monitor pattern and a transferred pattern of this mark according to the prior art.
Figure 3B:
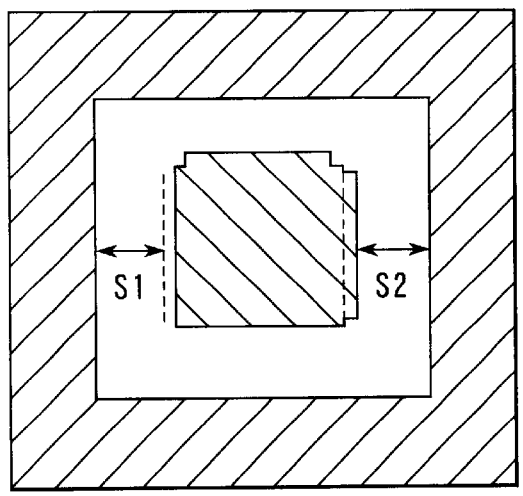
Figure 6:
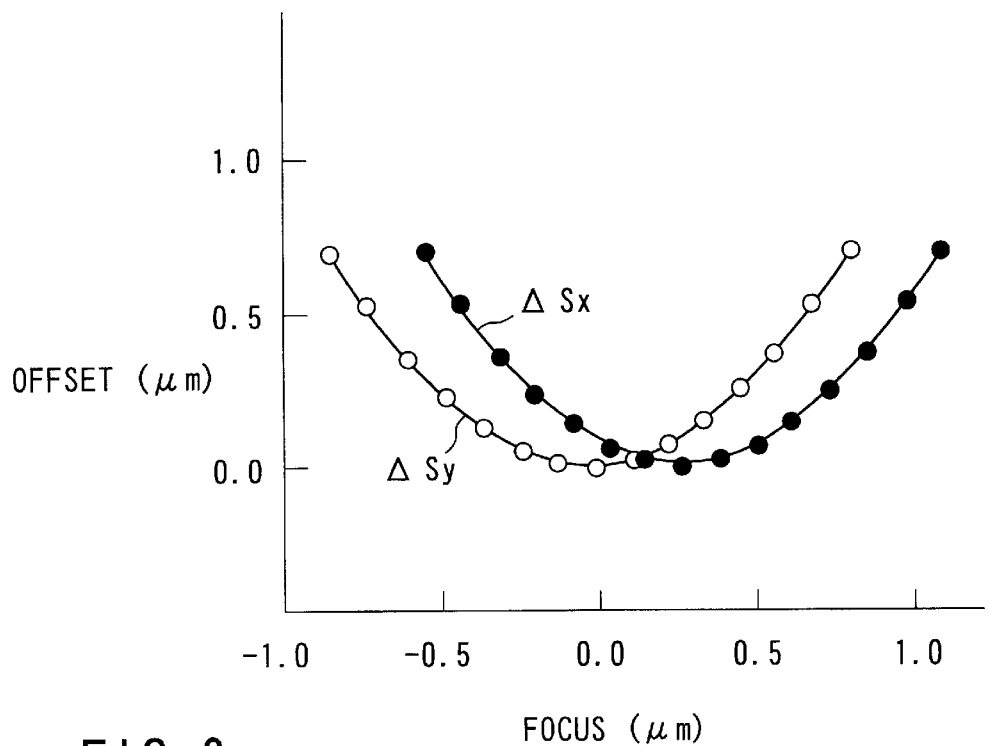
FIG. 6 is a graph explaining the relationship between the off-set of mark of each of various region shown in FIG. 5 and defocus.
Figure 7:
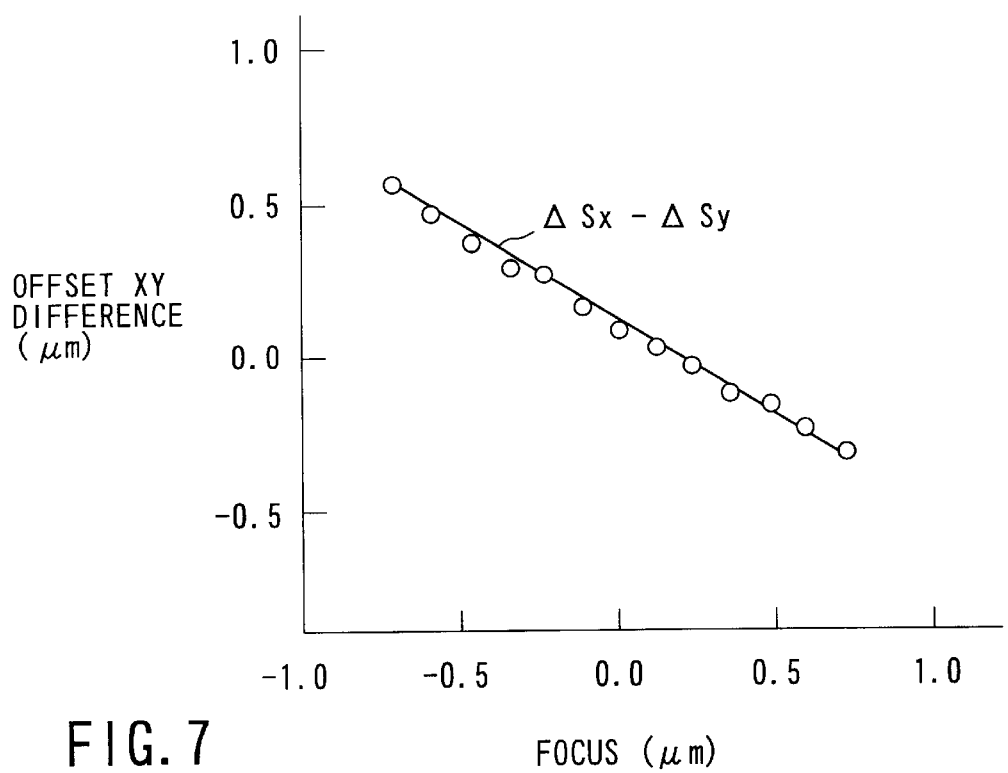
FIG. 7 is a graph explaining the relationship between a difference in magnitude of dislocation between two patterns and defocus.

One example of focus-monitoring mask according to a first embodiment of the present invention comprises a first pattern region having at least one first monitor pattern which is constituted by a first opening surrounded by a first film or constituted by the first film surrounded by the first opening; and a second pattern region having at least one second monitor pattern which is constituted by a second opening surrounded by a second film or constituted by the second film surrounded by the second opening, and is capable of giving a predetermined phase difference to an exposure light passing through said second film relative to an exposure light passing through said second opening.

Specific examples of this focus-monitoring mask according to the first embodiment of the present invention may be constructed as follows.

(1) It comprises not only a first pattern region having at least one wedge-like or rhomboid pattern which is constituted by a first opening and surrounded by a light-shielding film, but also a second pattern region having at least one wedge-like or rhomboid pattern which is constituted by a second opening and surrounded by a translucent film which is capable of giving a phase difference which is deviated by zero degree or 180 degrees from an exposure light passing through the second opening.

(2) It comprises not only a first pattern region having at least one wedge-like or rhomboid pattern which is constituted by a first opening and surrounded by a light-shielding film, but also a second pattern region having at least one wedge-like or rhomboid pattern which is constituted by a translucent film which is capable of giving a phase difference which is deviated by zero degree or 180 degrees from an exposure light passing through a second opening and surrounded by the second opening.

(3) It comprises not only a first pattern region having at least one wedge-like or rhomboid pattern which is constituted by a light-shielding film and surrounded by a first opening, but also a second pattern region having at least one wedge-like or rhomboid pattern which is constituted by a second opening and surrounded by a translucent film which is capable of giving a phase difference which is deviated by zero degree or 180 degrees from an exposure light passing through the second opening.

(4) It comprises not only a first pattern region having at least one wedge-like or rhomboid pattern which is constituted by a light-shielding film and surrounded by a first opening, but also a second pattern region having at least one wedge-like or rhomboid pattern which is constituted by a translucent film which is capable of giving a phase difference which is deviated by zero degree or 180 degrees from an exposure light passing through a second opening and surrounded by the second opening.

It is preferable in the focus-monitoring mask according to the first embodiment of the present invention that the phase difference of exposure light passing through the translucent film relative to an exposure light passing through the second opening is set to the range of from +45 degrees to +150 degrees or to the range of from −45 degrees to −150 degrees.

Another example of focus-monitoring mask according to the first embodiment of the present invention comprises a first pattern region having at least one monitor pattern constituted by a first translucent film and surrounded by a first opening, or constituted by a first opening and surrounded by a first translucent film, said monitor pattern of the first pattern region being capable of giving a predetermined phase difference to an exposure light passing through said first translucent film relative to an exposure light passing through said first opening; and a second pattern region having at least one monitor pattern which is constituted by a second translucent film and surrounded by a second opening or constituted by the second opening and surrounded by the second translucent film, said monitor pattern of the second pattern region being capable of giving a phase difference to an exposure light passing through said second translucent film relative to an exposure light passing through said second opening, this phase difference being different from the phase difference in the first pattern region.

Specific examples of this focus-monitoring mask according to the first embodiment of the present invention may be constructed as follows.

(1) It comprises not only a first pattern region having at least one wedge-like or rhomboid pattern which is constituted by a first opening and surrounded by a first translucent film which is capable of giving a phase difference which is deviated by zero degree or 180 degrees from an exposure light passing through the first opening, but also a second pattern region having at least one wedge-like or rhomboid pattern which is constituted by a second opening and surrounded by a second translucent film which is capable of giving a phase difference which is deviated by zero degree or 180 degrees from an exposure light passing through the second opening and is different from the phase difference to be derived from the first translucent film.

(2) It comprises not only a first pattern region having at least one wedge-like or rhomboid pattern which is constituted by a first opening and surrounded by a first translucent film which is capable of giving a phase difference which is deviated by zero degree or 180 degrees from an exposure light passing through the first opening, but also a second pattern region having at least one wedge-like or rhomboid pattern which is surrounded by a second opening and constituted by a second translucent film which is capable of giving a phase difference which is deviated by zero degree or 180 degrees from an exposure light passing through the second opening and is different from the phase difference to be derived from the first translucent film.

(3) It comprises not only a first pattern region having at least one wedge-like or rhomboid pattern which is surrounded by a first opening and constituted by a first translucent film which is capable of giving a phase difference which is deviated by zero degree or 180 degrees from an exposure light passing through the first opening, but also a second pattern region having at least one wedge-like or rhomboid pattern which is constituted by a second opening and surrounded by a second translucent film which is capable of giving a phase difference which is deviated by zero degree or 180 degrees from an exposure light passing through the second opening and is different from the phase difference to be derived from the first translucent film.

(4) It comprises not only a first pattern region having at least one wedge-like or rhomboid pattern which is surrounded by a first opening and constituted by a first translucent film which is capable of giving a phase difference which is deviated by zero degree or 180 degrees from an exposure light passing through the first opening, but also a second pattern region having at least one wedge-like or rhomboid pattern which is surrounded by a second opening and constituted by a second translucent film which is capable of giving a phase difference which is deviated by zero degree or 180 degrees from an exposure light passing through the second opening and is different from the phase difference to be derived from the first translucent film.

It is preferable in the focus-monitoring mask according to the first embodiment of the present invention that the phase difference of exposure light passing through the first translucent film relative to an exposure light passing through the first opening is set to the range of from +45 degrees to +150 degrees, and that the phase difference of exposure light passing through the second translucent film relative to an exposure light passing through the second opening is set to the range of from −45 degrees to −150 degrees.

The first and second translucent films may be constituted by a different material from each other or by the same material with each other. If the same material is employed for both first and second translucent films, these translucent films should preferably be formed after etching part of the transparent substrate for the purpose of giving a phase difference in the range of from −45 degrees to −150 degrees to the second pattern region.

According to the first embodiment of the present invention, there is also provided a method for focus monitoring which is designed to monitor a magnitude of defocus state on an occasion of transferring a pattern on a wafer by making use of any one of the aforementioned focus-monitoring mask.

According to this method, a pattern is transferred on a wafer by making use of a focus-monitoring mask, and the sizes of both first and second monitor patterns out of the pattern thus formed are measured, and on the basis of the sizes measured, a difference or ratio between the size of the first monitor pattern and the size of the second monitor pattern is measured.

In this case, the monitor pattern may be rhomboidal in configuration, and in the measuring step, the length of one of the diagonal lines of the monitor pattern which is longer than the other will be measured.

According to the first embodiment of the present invention, a focus-monitoring mask having the aforementioned first pattern region and second pattern region is transferred to a wafer so as to make it possible to precisely and conveniently determine a deviation from an best focus state that may be variously generated in the exposure process.

Namely, when a focus-monitoring pattern which is constructed as proposed by the present invention is transferred to the surface of wafer, a deviation is caused to generate between the first monitor pattern of the first pattern region and the second monitor pattern of the second pattern region relative to the best focus position, thereby giving respectively defocus characteristics thereof which differs from each other. As a result, by measuring the dimension of these two monitor patterns, the magnitude of defocus state (in any direction) can be determined.

Further, in the case of the focus monitoring mask where the first and second translucent films are employed, as a deviation is caused to generate in the range of from +45 degrees to +150 degrees on one of the films, and in the range of from −45 degrees to −150 degrees on the other film relative to an exposure light passing through the neighboring opening, a large difference is caused to generate in focus characteristics in the marks of these two regions, thereby making it possible to monitor the magnitude of defocus state (in any direction) with high sensitivity.

The focus-monitoring mask according to a second embodiment of the present invention comprises a first pattern region having at least one first monitor pattern which is constituted by a first opening surrounded by a first film or constituted by the first film surrounded by the first opening, and a second pattern region having at least one second monitor pattern which is constituted by a second opening surrounded by a second film or constituted by the second film surrounded by the second opening, and is capable of giving a predetermined phase difference to an exposure light passing through said second film relative to an exposure light passing through said second opening, said predetermined phase difference being different from that of said first pattern region; said second monitor pattern tapering in a direction which is opposite to the tapering direction of said first monitor pattern.

Specific examples of this focus-monitoring mask according to the second embodiment of the present invention may be constructed as follows.

(1) It is constructed such that the first film is a light-shielding film, and the second film is a translucent film which is capable of causing the phase of exposure light passing therethrough to differ from the phase of exposure light passing through the second opening.

(2) It is constructed such that the phase difference of exposure light passing through the second film relative to an exposure light passing through the second opening is set to the range of from +45 degrees to +150 degrees or to the range of from −45 degrees to −150 degrees.

(3) It is constructed such that the first film and the second film are both formed of the translucent film which enables an exposure light of the same phase to pass therethrough, and the phase difference of exposure light passing through the first opening differs from the phase difference of exposure light passing through the second opening.

(4) It is constructed such that the phase difference of exposure light passing through the first and second films relative to an exposure light passing through the first and second openings is set to the range of from +40 degrees to +165 degrees or to the range of from −40 degrees to −165 degrees.

(5) It is constructed such that the phase of exposure light passing through the first film and the second openings is the same with each other, and the phase of exposure light passing through the second film differs from the phase of exposure light passing through the second opening.

(6) It is constructed such that the focus monitor pattern is constituted by the first and second monitor patterns which are arrayed in one direction, and by the first and second monitor patterns which are arrayed in a direction perpendicular to the one direction.

(7) It is constructed such that the focus monitor pattern further comprises the first and second monitor patterns which are arrayed and inclined by plus or minus 45 degrees to the one direction.

(8) It is constructed such that the first pattern region is surrounded by the second pattern region; the second monitor pattern is constituted by a rectangular second opening or second film, every sides thereof being accompanied with a tapered pattern; and the tip end of tapered pattern of the second monitor pattern is directed opposite to the direction of the tip end of tapered pattern of the first monitor pattern.

(9) It is constructed such that the focus monitor pattern is formed at a dicing region where a device pattern is not disposed.

(10) It is constructed such that the focus monitor pattern is formed outside a dicing region.

(11) It is constructed such that the tapered pattern of each of the monitor patterns is formed of a wedge-like or rhomboid configuration.

According to the second embodiment of the present invention, there is also provided a method for focus monitoring which is featured in that a pattern is transferred on a wafer by making use of the aforementioned focus-monitoring mask, that the relative position between the first and second monitor patterns among the patterns formed on the wafer is measured, and that, on the basis of the relative position measured, a deviation of the relative position of focus is determined.

According to the second embodiment of the present invention, there is also provided a method for focus monitoring which is featured in that a pattern is transferred on a wafer by making use of a focus-monitoring mask having four groups of focus monitor pattern, each group of focus monitor pattern being designed such that the direction of distal end of said tapered pattern is set to an angle of 0 degree, +45 degrees, −45 degrees and 90 degrees, respectively, that the relative position between the monitor patterns of the first and second pattern regions among the patterns formed on the wafer is measured, and that, on the basis of the relative position measured, a deviation of focus that is resulted from an aberration of irradiation optical lens is corrected.

According to the second embodiment of the present invention, a couple of regions, i.e. a first pattern region and a second pattern region each having a monitor pattern are prepared, and then, a deviation is caused to generate between the first monitor pattern of the first pattern region and the second monitor pattern of the second pattern region relative to the best focus position, thereby giving respectively defocus characteristics thereof which differs from each other, so that by measuring the magnitude of the dislocation of these two monitor patterns, the magnitude of defocus state as well as the direction of deviation can be easily determined.

The present invention will be further explained with reference to the following examples illustrated also in the drawings.

First Example

According to this first example, as a monitor pattern (mark) for measuring the focus point, two kinds of marks, i.e. a rhomboidal mark formed in a light-shielding portion and a rhomboidal mark formed in a translucent film are disposed on the surface of the exposure mask.

Figure 8A:
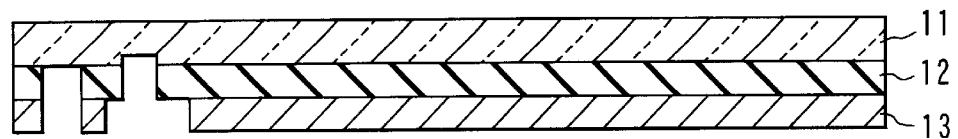
FIGS. 8A and 8B show a cross-sectional view and a plan view, respectively, for schematically illustrating the construction of the focus-monitoring mask according to a first example.
Figure 8B:
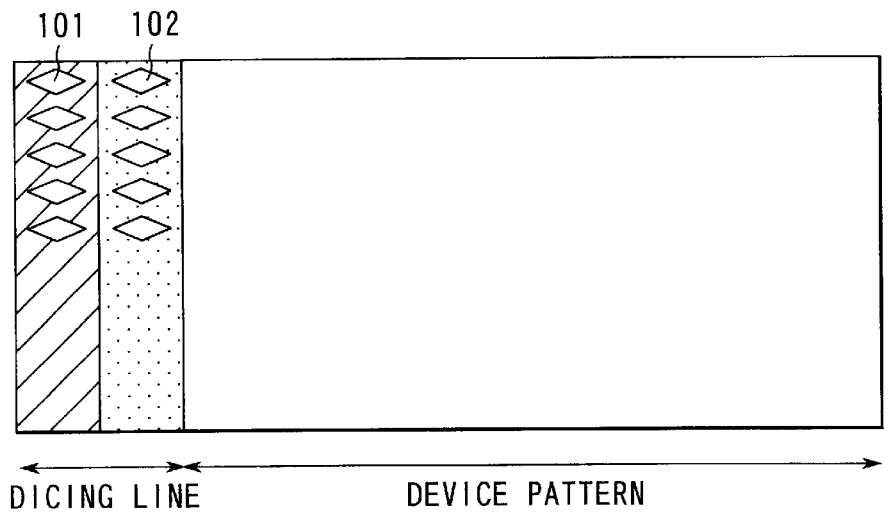

FIGS. 8A and 8B schematically illustrates the construction of the focus-monitoring mask according to this first example, wherein FIG. 8A is a cross-sectional view, and FIG. 8B is a plan view. The monitor pattern is formed at a region of mask (dicing line) where no device pattern is formed. In these FIGS., the reference number 11 denotes a transparent substrate such as glass substrate, 12 a translucent film made of $SiO_2$ for instance, and 13 a light-shielding film made of Cr for instance. Further, the reference number 101 represents a rhomboidal mark (a first opening) formed in the light-shielding film 13, and 102 a rhomboidal mark (a second opening) formed in the translucent film 12. By the way, the translucent film 12 has a transmissivity of 6% to the exposure light and acts to deviate a phase of exposure light by an angle of 180 degrees.

Figure 9:
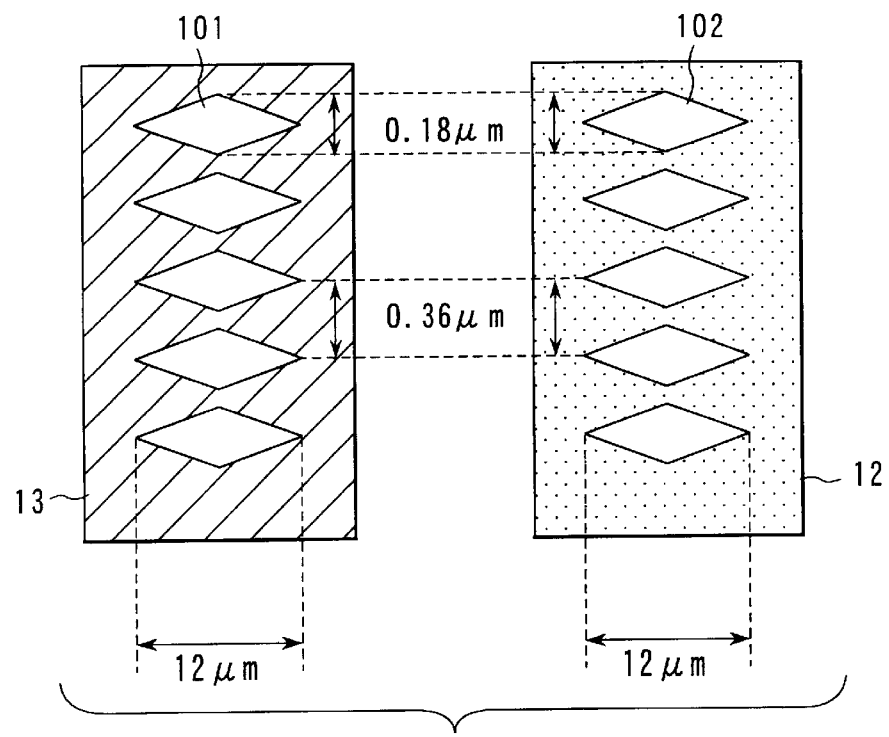
FIG. 9 is an enlarged plan view showing a monitor pattern of the mask shown in FIGS. 8A and 8B.

In the first pattern region where the rhomboidal mark 101 is formed as well as in the second pattern region where the rhomboidal mark 102 is formed, these marks five in number respectively are arrayed at a constant pitch. Each of these rhomboidal marks 101 and 102 is configured as shown in FIG. 9 such that, as reduced to based on the wafer, the length in the direction of X-axis is 12 $\mu$m, the length in the direction of Y-axis is 0.18 $\mu$m, and the pitch is 0.36 $\mu$m. By the way, for the purpose of providing a phase difference of 90 degrees between the exposure light passing through the translucent film 12 and the exposure light passing through the opening 102, a portion of the substrate corresponding to the rhomboidal mark 102 constituting the second opening is etched down to a depth of 124 nm for instance.

It has been noticed by the present inventors that when the phase of the exposure light passing through the translucent film 12 is differentiated by about 90 degrees from the phase of the exposure light passing through the translucent film, a deviation is caused to generate between the focus point of the rhomboidal pattern to be formed on the wafer, this rhomboidal pattern originating from the mark 102 of the translucent film portion and the focus point of the rhomboidal pattern to be formed on the wafer, this rhomboidal pattern originating from the mark 101 of the light-shielding film portion, thereby exhibiting a different dimensional characteristic of pattern to defocus. Therefore, the present invention is based on the following procedures. Namely, by taking advantage of the phenomenon that the dimension of pattern changes monotonically relative to defocus as a difference in dimension of pattern after the exposure and development of couple of marks is monitored, the relationship between the defocus and the difference in dimension of pattern can be represented in advance in the form of calibration curve. As a result, not only the magnitude of defocus but also the direction of the deviation can be monitored by simply measuring a difference in dimension of the patterns formed after the exposure and development thereof on the surface of wafer.

Next, the procedures for detecting the focus point by making use of the aforementioned couple of rhomboidal marks will be explained. First of all, in order to transfer the pattern of the focus-monitoring mask of this example which is provided with aforementioned marks on a wafer, the exposure thereof was performed under the same condition as that of the device pattern. Specifically, a coating type reflection preventive film having a thickness of 60 nm was formed on a wafer by means of spin coating, and then, a chemical amplification type positive resist was spin-coated to a thickness of 0.4 μm. Then, by making use of the aforementioned mask, the wafer was subjected to exposure under the conditions of: 1/4 in reduction ratio of projecting optical system, 248 nm in exposure light wavelength, 0.6 in NA, 0.75 in coherence factor σ, 0.67 in ring zone shielding factor ε, and 7.5 mJ/cm² in exposure dosage set in the exposure apparatus.

After finishing the exposure, the wafer was subjected to a post exposure baking (PEB) at a temperature of 100° C., which was followed by the development thereof for 60 seconds using an alkaline developing solution of 0.21N.

Then, the dimension of these two kinds of rhomboidal patterns formed on this processed wafer was measured using an optical line width measuring apparatus, thus determining a difference between the pattern size L' in the direction of X-axis in the rhomboidal mark 102 of the translucent film portion and the pattern size L in the direction of X-axis in the rhomboidal mark 101 of the light-shielding film portion.

Figure 10:
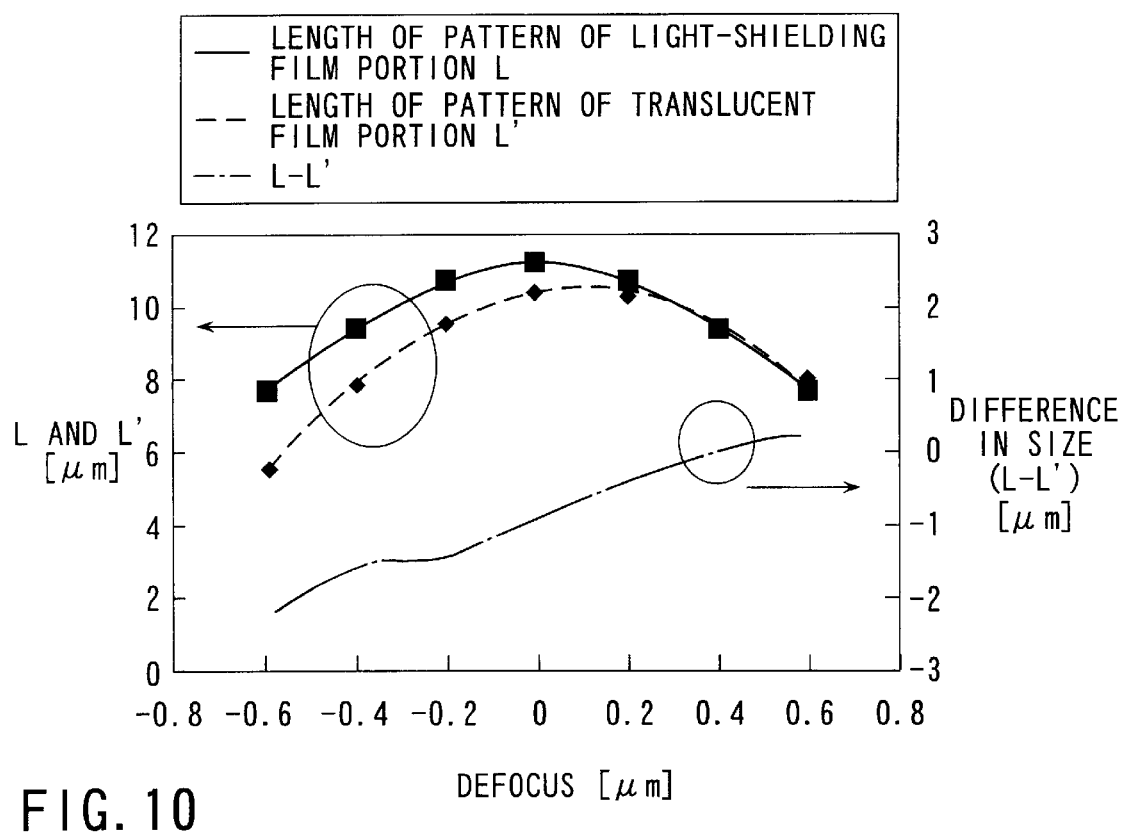
FIG. 10 is a graph explaining the relationship between a dimensional difference (L–L') obtained from an exposure and defocus.

FIG. 10 shows the relationship (calibration curve) between a dimensional difference (L–L') obtained from the exposure and defocus. The abscissa in this graph represents the defocus, and the ordinate represents the dimension of patterns (L or L') of the rhomboidal marks 101 and 102 as well as a difference in dimension. Among these three curves shown therein, the solid line represents the dimensional characteristic of pattern of the rhomboidal mark 101 of the light-shielding film portion, the dotted line represents the dimensional characteristic of pattern of the rhomboidal mark 102 of the translucent film portion, and the dot and dash line represents the characteristic of dimensional difference relative to the defocus wherein the dimensional difference is obtained by subtracting the dimension of rhomboidal pattern of the light-shielding film portion from the dimension of rhomboidal pattern of the translucent film portion. Since this characteristic of dimensional difference was indicated as such that the dimensional difference increase monotonically in proportion to the defocus, it was possible to determine the magnitude of dislocation or deviation of focus together with the sign of deviation.

Figure 11:
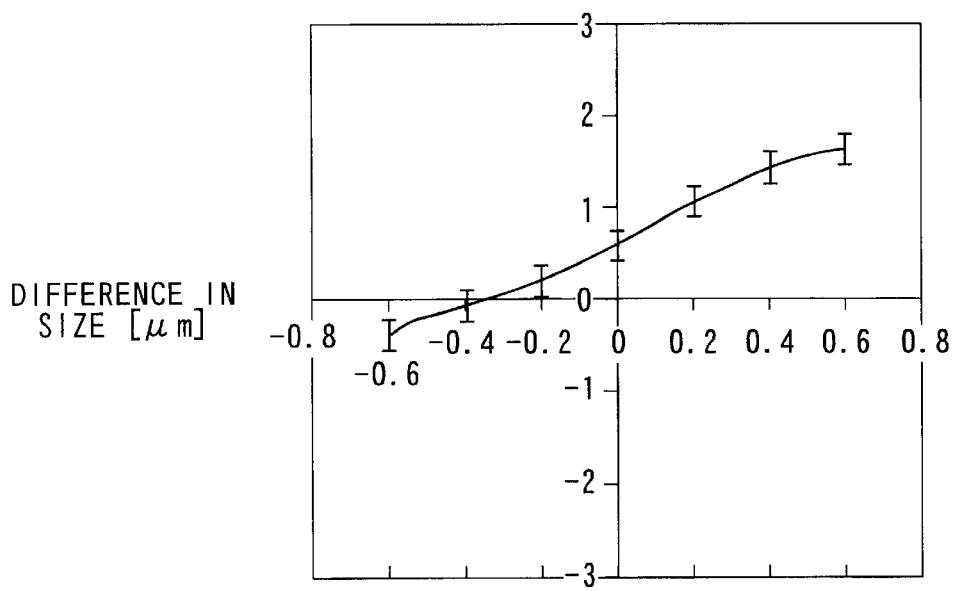
FIG. 11 is a graph explaining the dose dependency of the relationship between a dimensional difference and defocus (calibration curve)

Additionally, the exposure dose was varied on the occasion of exposure so as to investigate the dose dependency of calibration curve. Specifically, the exposure was performed while varying the exposure dose in the range of –10% to +10% from the central value thereof which was set to 7.5 mJ/cm². FIG. 11 shows the dose dependency of the relationship between a dimensional difference and defocus (calibration curve), More specifically, FIG. 11 shows the relationship between a dimensional difference and defocus when the exposure dose was varied at ratios of –10%, –5%, –1%, 0%, +1%, +5%, +10% from the central value, i.e. 7.5 mJ/cm².

As seen from the graph of FIG. 11, even if the exposure dose was varied within the range of –10% to +10%, any substantial change in defocus dependency was not recognized (each line in the graph was substantially overlapped with other lines). Therefore, even if the exposure dose was fluctuated, it was possible, according to the focus-monitoring mask of this example, to detect the magnitude of defocus with high precision.

By making use of the aforementioned mask, the processing of each lot was performed under the same exposure and development conditions as those employed in the actual device pattern. Then, several pieces of wafer were taken up from the processed lot, and a difference between the pattern size L' of the rhomboidal mark 102 of the translucent film portion and the pattern size L of the rhomboidal mark 101 of the light-shielding film portion was determined. Based on this difference thus obtained, the magnitude of defocus was determined together with the sign thereof by making use of the calibration curve shown in FIG. 10. Then, an average value was determined from several values of focus deviation, the resultant average value being determined as a magnitude of defocus in the lot. In the exposure process of the next lot, this average value was fed back for setting the focus of the exposure apparatus. As a result, it was possible to suppress the fluctuation of line width originating from the deviation of focus.

In the foregoing embodiment, the magnitude of defocus in the pattern on the surface of wafer that has been obtained from the aforementioned focus-monitoring mask was employed as a feed-back data for the next lot. However, the focus point of the device pattern may not necessarily be the same as the focus point of the focus-monitoring mark due to the aberration of the exposure apparatus or due to the stepped configuration of the underlying layer of the device pattern. If so, an off-set value which is peculiar to the device can be added to the value of deviation of focus that has been obtained from the focus-monitoring mask, the resultant value being adopted as being the deviation value of focus and employed as a feed-back data.

In this example, the marks for detecting the focus were measured by making use of an optical line width-measuring apparatus which is disposed independent from the exposure apparatus. However, it is also possible to employ a line width-measuring function which is built in the exposure apparatus per se, a non-optical type measuring apparatus such as SEM. Further, the monitor pattern may be of any configuration as long as it is formed of a mark that can be measured using a line width-measuring apparatus. For example, the monitor pattern may be formed of a wedge-like configuration. The rhomboid or wedge-like configuration may not necessarily be formed so as to have a sharp tip end. Namely, as long as the distal end portion of the mark is made narrower than the central portion thereof, it is capable of functioning as a focus-monitoring pattern. Further, the size and pitch of translucent film portion of the focus-monitoring pattern as well as the transmissivity of translucent film portion of the focus-monitoring pattern may not be confined to those shown in FIG. 9, but may be modified in various ways depending on the exposure conditions to be employed so as to improve the performance of detecting the focus.

Moreover, the relationship between the light-shielding portion and opening portion in the first pattern region may be reversed. Namely, the monitor pattern may be formed of a light-shielding film having a rhomboid or wedge-like configuration which is surrounded by an opening portion. Likewise, the relationship between the translucent film portion and opening portion in the second pattern region may be reversed. Namely, the monitor pattern may be formed of a translucent film having a rhomboid or wedge-like configuration which is surrounded by an opening portion. Even if these constructions is combined in any manner, the same effects as those obtainable in this example can be obtained.

In this example, a translucent film 12 exhibiting a phase difference of 180 degrees was employed and the substrate was partially etched off for the purpose of giving a phase difference of 90 degrees to the exposure light passing through the periphery of the opening 102 in the second pattern region relative to the exposure light passing through the opening 102 in the second pattern region. However, if a translucent film having a phase difference of 90 degrees is employed, the aforementioned partial etching of substrate would not be required. Further, the phase difference between the exposure light passing through the periphery of the opening 102 and the exposure light passing through the opening 102 in the second pattern region may not be confined to 90 degrees, but may be optionally selected as long as it is capable of generating a variation in best focus position between the rhomboidal mark 101 of the light-shielding film portion and the rhomboidal mark 102 of the translucent film portion.

As for the materials for the translucent film, it is possible to employ molybdenum silicide oxynitride (MoSiON), molybdenum silicide nitride (MoSiN), chromium fluoride (CrF), zirconium silicide (GrSiO), etc. Further, the transmissivity of the translucent film is not limited to 6%, but may be optionally altered depending on the specification of product to obtain. According to the experiments performed by the present inventors, the transmissivity of the translucent film may be in the range of 3 to 15%.

Figure 12:
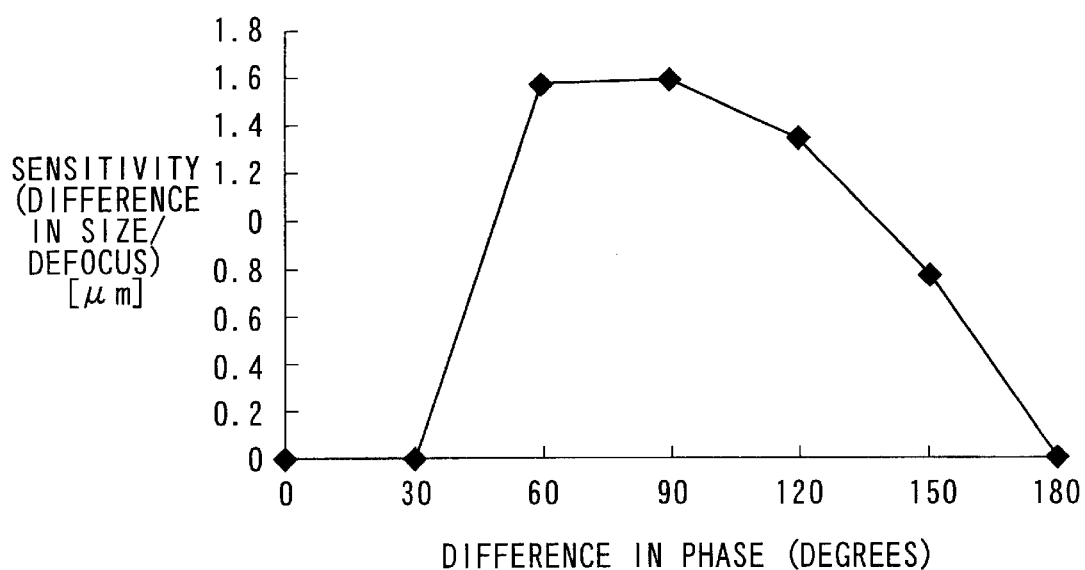
FIG. 12 is a graph explaining the relationship between the sensitivity of detecting focus and a phase difference between the translucent film portion and the transparent portion of the mark shown in FIG. 9.

FIG. 12 shows the relationship between the sensitivity of detecting focus and a phase difference between the translucent film portion and the transparent portion of the mark shown in FIG. 9. It will be seen from FIG. 12 that if the detection accuracy of focus deviation required is assumed to be 0.05 $\mu$m, and the measurement accuracy of the line width-measuring apparatus required is assumed to be 0.02 $\mu$m, the limit of detection sensitivity required for the focus monitoring would be: sensitivity (dimensional difference/defocus)=[$\Delta L - \Delta L'$]/[$\Delta$focus]=0.8, so that the limit of detection sensitivity should be 0.8 or more. Therefore, the phase difference is required to be set within the range of 45 degrees to 150 degrees.

Second Example

According to this second example, as a monitor pattern (mark) for measuring the focus point, a rhomboidal mark made of a translucent film is disposed on the surface of the exposure mask. The features which differ from the aforementioned first example are that the translucent film is disposed in both first and second pattern regions, and that by forming a rhomboidal mark, a phase difference of +90 degrees is secured in the first pattern region and a phase difference of -90 degrees is secured in the second pattern region.

Figure 13A:
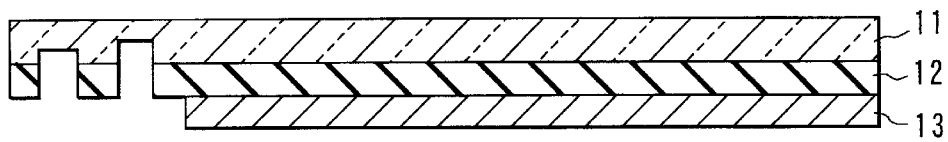
FIGS. 13A and 13B show a cross-sectional view and a plan view, respectively, for schematically illustrating the construction of the focus-monitoring mask according to a second example.
Figure 13B:
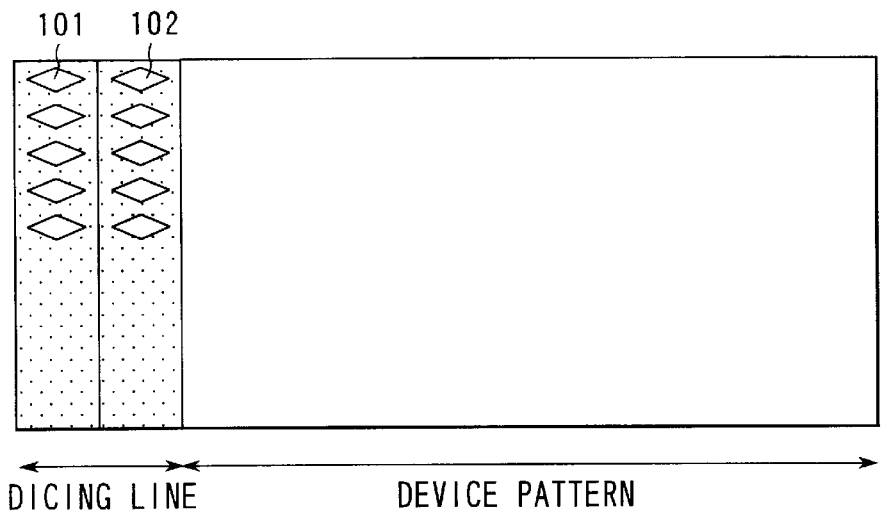

FIGS. 13A and 13B schematically illustrates the construction of the focus-monitoring mask according to this second example, wherein FIG. 13A is a cross-sectional view, and FIG. 13B is a plan view. The monitor pattern is formed at a light-shielding portion of a region of mask (dicing line) where no device pattern is formed. In these FIGS., the reference number 11 denotes a transparent substrate, 12 a translucent film, and 13 a light-shielding film. Further, the reference numbers 201 and 202 represent respectively a rhomboidal mark. By the way, the translucent film 12 has a transmissivity of 6% to the exposure light and acts to deviate a phase of exposure light by an angle of 180 degrees.

In the first pattern region where the rhomboidal mark 201 (first opening) is formed, a portion of the substrate 11 which is exposed through the opening portion is partially etched (for example, 124 nm), so that the light passing through the peripheral translucent film 12 is allowed to have a phase difference of +90 degree relative to the light passing through the rhomboidal mark 201 constituting the opening. On the other hand, in the second pattern region where the rhomboidal mark 202 (second opening) is formed, a portion of the substrate 11 which is exposed through the opening portion is partially etched (for example, 372 nm), so that the light passing through the peripheral translucent film 12 is allowed to have a phase difference of -90 degree relative to the light passing through the rhomboidal mark 202 constituting the opening.

Figure 14:
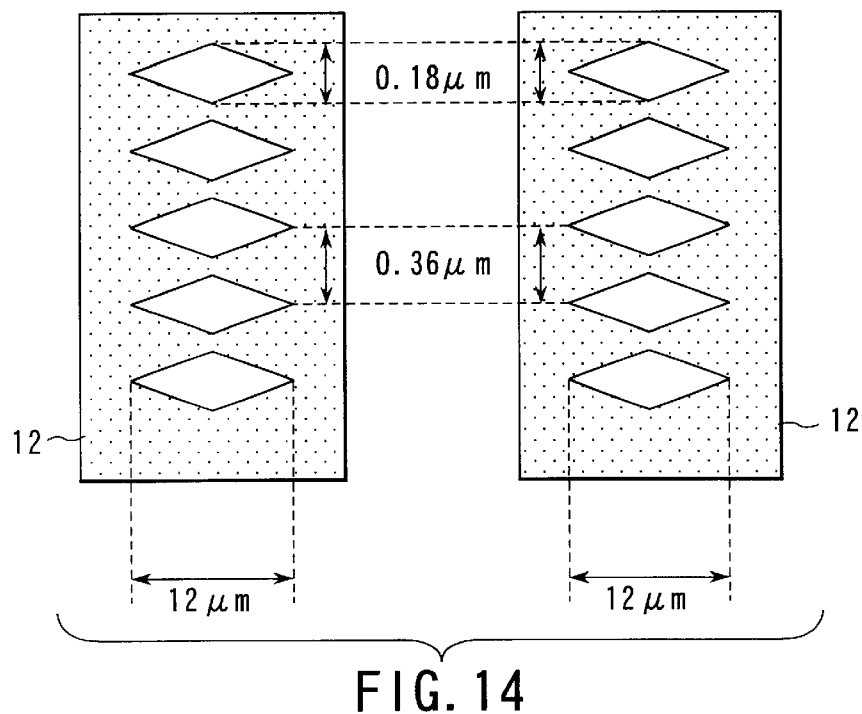
FIG. 14 is an enlarged plan view showing a monitor pattern of the mask shown in FIGS. 13A and 13B.

In the first and second pattern regions, the marks five in number respectively are arrayed at a constant pitch. Each of these rhomboidal marks 201 and 202 is configured as shown in the plan view of FIG. 14 such that, as reduced to based on the wafer, the length in the direction of X-axis is 12 $\mu$m, the length in the direction of Y-axis is 0.18 $\mu$m, and the pitch is 0.36 $\mu$m.

In the aforementioned first example, a mask having a rhomboidal mark in each of the light-shielding film portion and the translucent film portion is employed for forming a pattern on the surface of wafer, finding that a difference in dimension of the pattern of each of the marks of the light-shielding film portion and the translucent film portion decreases or increases monotonically in proportion of defocus.

Therefore, with a view to further improve the detection sensitivity of the magnitude of defocus, it has been proposed by the present inventors to shift the phase of exposure light passing through the translucent film 12 by an angle of +90 degrees relative to the phase of exposure light passing through the opening 201 in the first pattern region, and to shift the phase of exposure light passing through the translucent film 12 by an angle of about -90 (270) degrees relative to the phase of exposure light passing through the opening 202 in the second pattern region. As a result, the magnitude of defocus point of the rhomboidal mark 201 of translucent film portion where the phase of the exposure light passing through the opening 201 was shifted by an angle of about +90 degrees and the focus point of the rhomboidal mark formed in the light-shielding film portion was changed by a magnitude described in the first example.

Whereas, the focus point of the rhomboidal mark 202 of translucent film portion where the phase of the exposure light passing through the opening 202 was shifted by an angle of about -90 degrees exhibited the same absolute value of deviation described in the first example and the opposite sign relative to the focus point of the rhomboidal mark formed in the light-shielding film portion. As a result, it is possible to improve the detection sensitivity of magnitude of defocus which is twice as high as that of the first example.

Next, the procedures for detecting the focus point by making use of the aforementioned couple of rhomboidal marks will be explained. In the same manner as explained in the first example, a coating type reflection preventive film having a thickness of 60 nm was formed on a wafer by means of spin coating, and then, a chemical amplification type positive resist was spin-coated to a thickness of 0.4 $\mu$m. Then, by making use of the aforementioned mask, the wafer was subjected to exposure under the conditions of: 1/4 in reduction ratio of projecting optical system, 248 nm in exposure light wavelength, 0.6 in NA, 0.75 in coherence factor $\sigma$, 0.67 in ring zone shielding factor $\epsilon$, and 7.5 mJ/cm$^2$ in exposure dosage set in the exposure apparatus.

After finishing the exposure, the wafer was subjected to a post exposure baking (PEB) at a temperature of 100° C., which was followed by the development thereof for 60 seconds using an alkaline developing solution of 0.21N.

Then, the dimension of these two kinds of rhomboidal patterns formed on this processed wafer was measured using an optical line width measuring apparatus, thus determining a difference in dimension of the marks.

Figure 15:
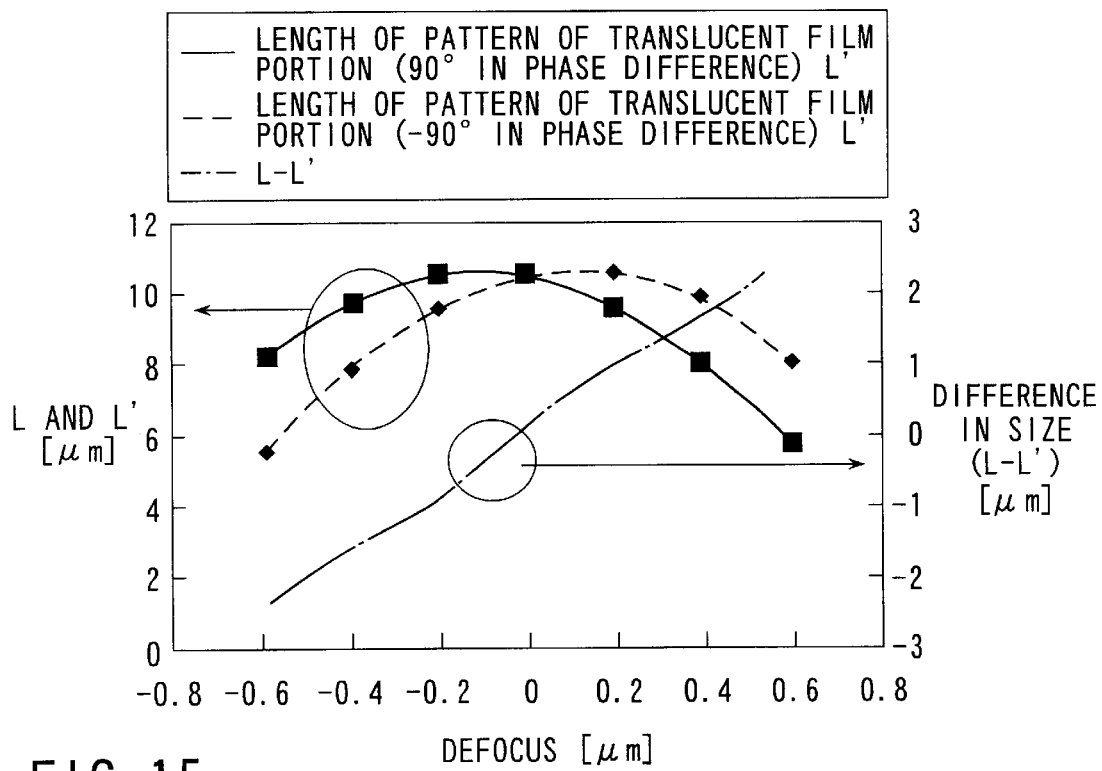
FIG. 15 is a graph explaining the relationship between a dimensional difference (L–L') obtained from an exposure and defocus.
Figure 16:
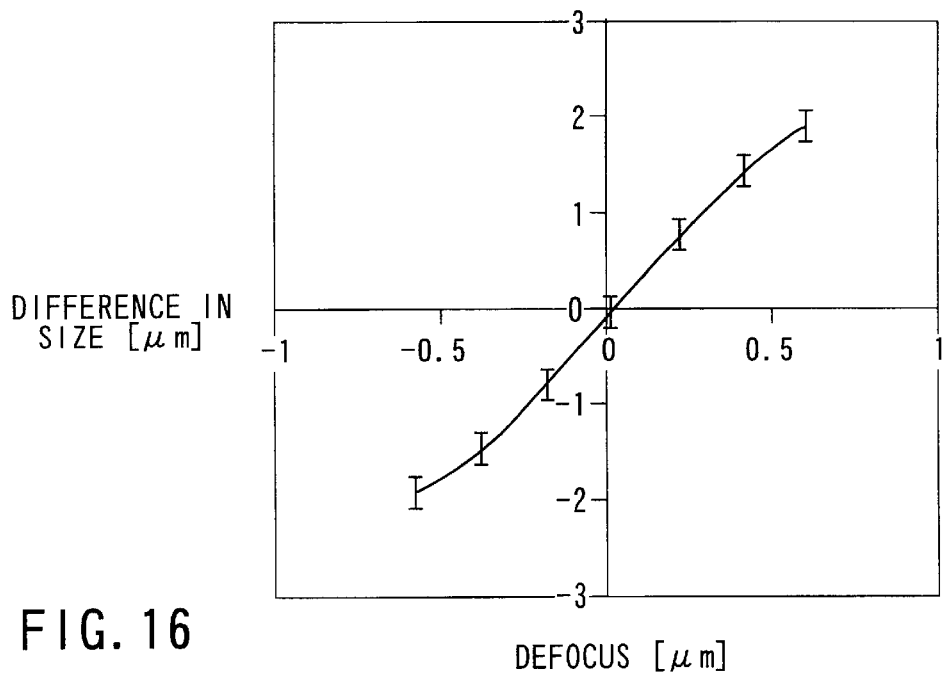
FIG. 16 is a graph explaining the dose dependency of the relationship between a dimensional difference and defocus (calibration curve)

FIG. 15 shows the relationship (calibration curve) between a dimensional difference (L–L') obtained from the exposure and defocus. The abscissa in this graph represents the defocus, and the ordinate represents the dimension of patterns (L or L') of the rhomboidal marks 201 and 202 as well as a difference in dimension. Among these three curves shown therein, the solid line represents the dimensional characteristic of pattern of the rhomboidal mark 201 of the light-shielding film portion, and the dotted line represents the dimensional characteristic of pattern of the rhomboidal mark 202 of the translucent film portion.

The dot and dash line represents the dimensional difference (L–L') which was obtained by subtracting the length L' of pattern which was transferred on a wafer through the rhomboidal mark 202 formed in the translucent film portion whose phase difference relative to the opening is set to –90 degrees from the length L of pattern which was transferred on a wafer through the rhomboidal mark 201 formed in the translucent film portion whose phase difference relative to the opening is set to +90 degrees.

From these results, it was found possible to increase the detection sensitivity of magnitude of defocus to twice as high as that of the first example.

Additionally, the exposure dose was varied on the occasion of exposure so as to investigate the dose dependency of calibration curve. Specifically, the exposure was performed while varying the exposure dose in the range of –10% to +10% from the central value thereof which was set to 7.5 $mJ/cm^2$. FIG. 11 shows the dose dependency of the relationship between a dimensional difference and defocus (calibration curve), More specifically, FIG. 11 shows the relationship between a dimensional difference and defocus when the exposure dose was varied at ratios of –10%, –5%, –1%, 0%, +1%, +5%, +10% from the central value, i.e. 7.5 $mJ/cm^2$.

It will be seen from this graph that even if the exposure dose was varied within the range of –10% to +10%, any substantial change in defocus dependency was not recognized (each line in the graph was substantially overlapped with other lines). Therefore, even if the exposure dose was fluctuated, it was possible, even in this example, to detect the magnitude of defocus with high precision.

By making use of the aforementioned mask, the processing of each lot was performed under the same exposure and development conditions as those employed in the actual device pattern. Then, several pieces of wafer were taken up from the processed lot, and a difference between the pattern size L' of the rhomboidal mark 202 of the translucent film portion and the pattern size L of the rhomboidal mark 201 of the light-shielding film portion was determined. Based on this difference thus obtained, the magnitude of defocus was determined together with the sign thereof by making use of the calibration curve shown in FIG. 15. Then, an average value was determined from several values of focus deviation, the resultant average value being determined as a magnitude of defocus in the lot. In the exposure process of the next lot, this average value was fed back for setting the focus of the exposure apparatus. As a result, it was possible to suppress the fluctuation of line width originating from the deviation of focus.

In the foregoing embodiment, the magnitude of defocus in the pattern on the surface of wafer that has been obtained from the aforementioned focus-monitoring mask was employed as a feed-back data for the next lot. However, the focus point of the device pattern may not necessarily be the same as the focus point of the focus-monitoring mark due to the aberration of the exposure apparatus or due to the stepped configuration of the underlying layer of the device pattern. If so, an off-set value which is peculiar to the device can be added to the value of deviation of focus that has been obtained from the focus-monitoring mask, the resultant value being adopted as being the deviation value of focus and employed as a feed-back data.

In this example, the marks for detecting the focus were measured by making use of an optical line width-measuring apparatus which is disposed independent from the exposure apparatus. However, it is also possible to employ a line width-measuring function which is built in the exposure apparatus per se, a non-optical type measuring apparatus such as SEM. Further, the monitor pattern may be of any configuration as long as it is formed of a mark that can be measured using a line width-measuring apparatus. For example, the monitor pattern may be formed of a wedge-like configuration. The rhomboid or wedge-like configuration may not necessarily be formed so as to have a sharp tip end. Namely, as long as the distal end portion of the mark is made narrower than the central portion thereof, it is capable of functioning as a focus-monitoring pattern. Further, the size and pitch of translucent film portion of the focus-monitoring pattern as well as the transmissivity of translucent film portion of the focus-monitoring pattern may not be confined to those shown in FIG. 14, but may be modified in various ways depending on the exposure conditions to be employed so as to improve the performance of detecting the focus.

Moreover, the relationship between the light-shielding portion and opening portion in the first pattern region may be reversed. Namely, the monitor pattern may be formed of a light-shielding film having a rhomboid or wedge-like configuration which is surrounded by an opening portion. Likewise, the relationship between the translucent film portion and opening portion in the second pattern region may be reversed. Namely, the monitor pattern may be formed of a translucent film having a rhomboid or wedge-like configuration which is surrounded by an opening portion. Even if these constructions is combined in any manner, the same effects as those obtainable in this example can be obtained.

In this example, the same translucent film was employed for both first pattern region and second pattern region, and the etching magnitude of the transparent substrate of the opening portion is altered to bring about a difference in phase difference between the first pattern region and the second pattern region. Instead, the first and second pattern regions may be constituted by a different kind of translucent film, respectively.

According to the aforementioned first embodiment of the present invention, a couple of regions, i.e. the first and second pattern regions each having a monitor pattern are prepared, and a deviation is caused to generate in the best focus position between the monitor pattern of the first pattern region and the monitor pattern of the second pattern region, thereby giving a different defocus characteristic from each other, so that by measuring the dimension of this couple of monitor patterns, the magnitude as well as direction of deviation from the best focus state can be determined.

In this case, the conventional procedure of preliminary exposure wherein defocus is caused to vary would no more required. Namely, what is required is to determine the dimension of monitor pattern after a single exposure. Moreover, the method according to this embodiment can be hardly influenced by the fluctuation of the quantity of exposure, thus making it possible to secure a sufficient sensitivity even under the conditions of relatively large α or annular irradiation. Therefore, it is possible to precisely and conveniently detect the magnitude and direction of deviation from the state of focus, thereby contributing to the improvement of exposure precision.

Following examples represent a second embodiment of the present invention.

Third Example

Figure 17:
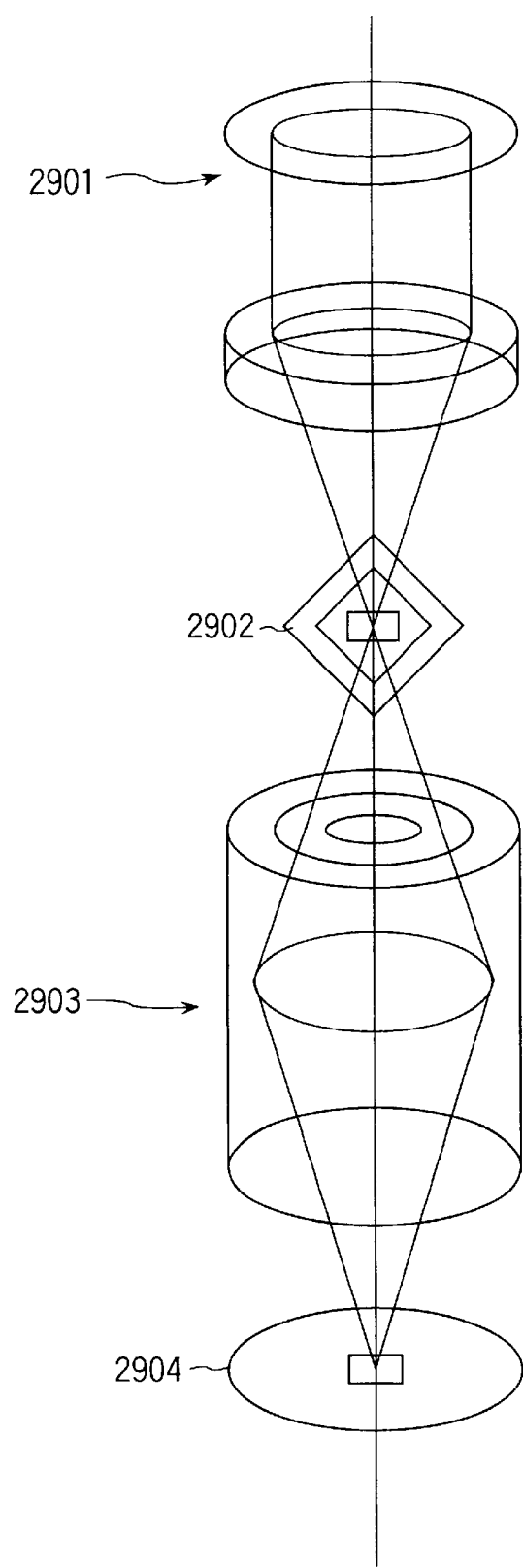
FIG. 17 is a diagram schematically illustrating the entire structure of the system according to a third example.

FIG. 17 is a diagram schematically illustrating the entire structure of the system according to the present invention. In FIG. 17, the reference number 2901 denotes a light source, 2902 a photomask, 2903 a projecting optical system, and 2904 a wafer.

FIGS. 18A, 18B, 18C and 18D respectively illustrates schematically the construction provided with the focus-monitoring pattern according to the present invention, wherein FIG. 18A is a cross-sectional view of a mask, FIG. 18B is a plan view of the mask, FIG. 18C is a plan view of the focus-monitoring pattern, and FIG. 18D is an enlarged plan view of the focus-monitoring pattern.

As shown in FIG. 18A, a light-shielding film 3 is formed via a translucent film 2 made of $SiO_2$ for example on a glass substrate 1. This translucent film 2 is capable of functioning to shift the phase of exposure light by an angle of 180 degrees and has a transmissivity of 6%. The focus-monitoring pattern is formed on the dicing line located at the periphery of device pattern.

As shown in FIG. 18B, the focus-monitoring pattern is constituted by a translucent film portion 801 located at the periphery thereof, a light-shielding film portion 802 located at the central portion thereof, a first monitor pattern 301 constituting an opening, and a second monitor pattern 302 constituting an opening. Both first and second monitor patterns 301 and 302 are constituted by rectangular patterns 310a and 310b, and a large number of fine tapered patterns (saw-tooth pattern) 311a and 311b which are formed on one side of the rectangular patterns 310a and 310b, respectively. By the way, for the purpose of providing a phase difference of 90 degrees between the exposure light passing through the translucent film 2 and the exposure light passing through the opening, a portion of the substrate 1 where the first monitor pattern 301 is located is partially etched down to a depth of 124 nm for instance.

In FIG. 18C, a wedge-like pattern is shown as one example of the tapered pattern 311. This tapered pattern 311 is configured such that the length in the direction of X-axis is 6 μm, the length in the direction of Y-axis is 0.18 μm, and the pitch is 0.36 μm. A plurality of the tapered patterns 311 are arrayed in the mask. In this case, the tapered patterns 311 are orientated in mask in such a manner that the distal end of the pattern is directed in the same direction in the light-shielding film portion 802 (the translucent film portion 801) and directed in the opposite direction (symmetrically) so as to face to each other in the light-shielding film portion 802 and the translucent film portion 801.

It has been noticed by the present inventors that when the phase of the exposure light passing through the translucent film 801 is differentiated by about 90 degrees from the phase of the exposure light passing through the mark 301, a deviation is caused to generate between the focus point of the tapered pattern 311a formed in the translucent film 801 and the focus point of the tapered pattern 311b formed in the light-shielding film portion 802, thereby exhibiting a difference in deviation relative to the defocus. Namely, as the focus becomes more close to the best focus, more finer portion of the tapered patterns 311a and 311b can be resolved, and the position of edge of resist varies depending on the magnitude of defocus.

Figure 19:
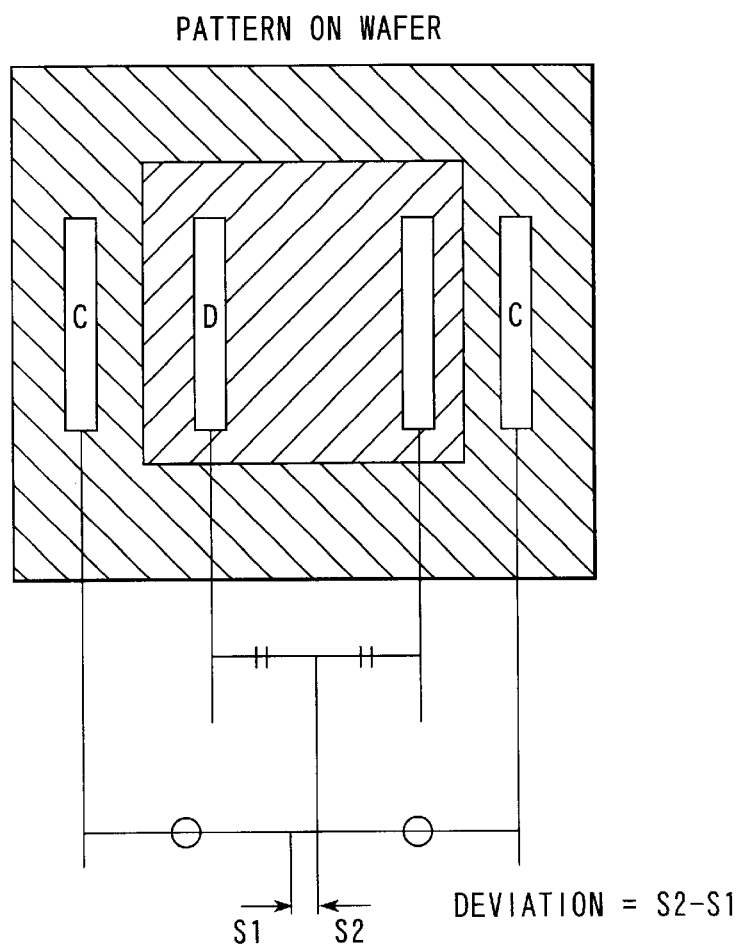
FIG. 19 is a plan view showing a pattern that has been obtained by transferring the focus monitor pattern shown in FIG. 18C on a wafer.

FIG. 19 shows a pattern that has been transferred from the focus monitor pattern shown in FIG. 18C to a wafer. The pattern D transferred from the second monitor pattern 302 of the light-shielding film portion 802 is designed such that the central position in the state of best focus becomes zero. Whereas, the pattern C where the first monitor pattern 301 of the translucent 801 is transferred is designed such that by shifting the phase by an angle of 90 degrees relative to the second monitor pattern, the central position of best focus would be located other than zero.

Further, by taking advantage of the phenomenon that a difference (the magnitude of deviation) of the central position of pattern increases or decrease monotonically relative to defocus as the difference in central position of pattern after the exposure and development of couple of monitor patterns 301 and 302 is monitored, the relationship between the defocus and the magnitude of deviation of pattern can be represented in advance in the form of calibration curve. Therefore, it has been tried to monitor not only the magnitude of defocus but also the direction of the deviation of focus by simply measuring the magnitude of deviation of the patterns relative to the defocus after the exposure and development thereof.

Next, the procedures for detecting the focus point by making use of a sample prepared using the aforementioned mask will be explained.

A wafer to which the pattern of mask having the monitor patterns 301 and 302 was subjected to an exposure under the same condition as that of the device pattern. Specifically, a coating type reflection preventive film having a thickness of 60 nm was formed on a wafer by means of spin coating, and then, a chemical amplification type positive resist was spin-coated to a thickness of 0.4 μm. Then, by making use of the aforementioned mask, the wafer was subjected to exposure under the conditions of: 1/4 in reduction ratio of projecting optical system, 248 nm in exposure light wavelength, 0.6 in NA, 0.75 in coherence factor σ, 0.67 in ring zone shielding factor ε, and 7.5 mJ/cm² in exposure dosage set in the exposure apparatus.

After finishing the exposure, the wafer was subjected to a post exposure baking (PEB) at a temperature of 100° C., which was followed by the development thereof for 60 seconds using an alkaline developing solution of 0.21N.

Then, the difference of the central position of these two patterns C and D formed on this developed wafer (i.e. the magnitude of deviation=S1−S2) was measured using an alignment-measuring apparatus.

Figure 20:
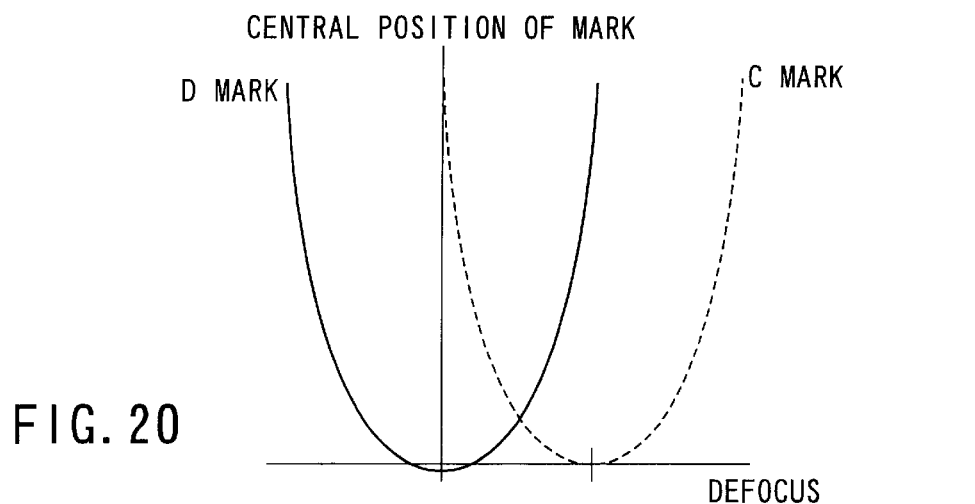
FIG. 20 is a graph illustrating the defocus dependency of the central position of mark.

FIG. 20 shows the relationship between the defocus and the central position of two marks C and D where the first monitor pattern 301 of the translucent film portion 801 and the second monitor pattern 302 of the light-shielding film portion 802 are transferred. The abscissa in this graph represents the defocus, and the ordinate represents a relative distance.

Among these two curves shown therein, the solid line represents the central position of the pattern D which was transferred on a wafer through the second monitor pattern 302 of the light-shielding film portion 802, and the dotted line represents the central position of the pattern C which was transferred on a wafer through the first monitor pattern 301 formed in the translucent film portion 801 exhibiting a phase difference of +90 degrees relative to the opening portion.

Figure 21:
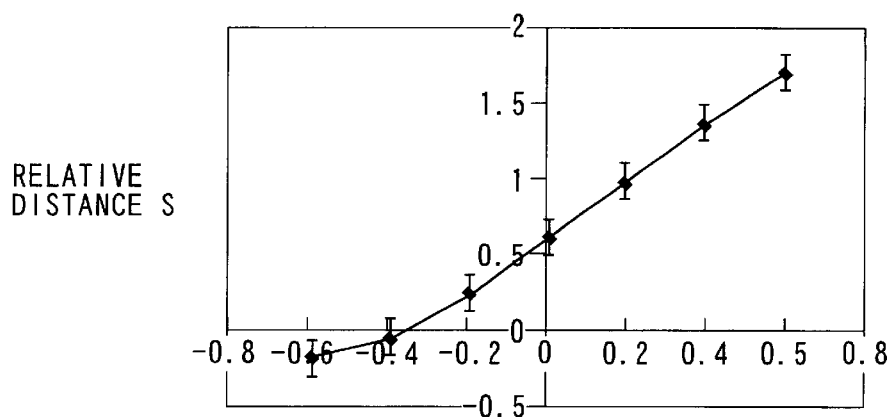
FIG. 21 is a graph illustrating the relationship between defocus and the magnitude of dislocation of the pattern that has been obtained by transferring the focus monitor pattern shown in FIG. 18C on a wafer.

FIG. 21 shows the relationship between defocus and the magnitude of dislocation between the pattern C which was transferred on a wafer through the first monitor pattern 301 formed in the translucent film portion 801 exhibiting a phase difference of +90 degrees relative to the opening portion and the pattern D which was transferred on a wafer through the second monitor pattern 302 formed in the light-shielding film portion. Since this magnitude of deviation increased monotonically relative to the magnitude of defocus, the magnitude of defocus could be determined together with the sign thereof. The relationship between the defocus and the magnitude of positional deviation can be expressed as a calibration curve.

Additionally, the exposure dose was varied on the occasion of exposure so as to investigate the dose dependency of calibration curve. Specifically, the exposure was performed while varying the exposure dose in the range of −10% to +10% from the central value thereof which was set to 7.5 mJ/cm$^2$. FIG. 21 shows the dose dependency of the relationship between the positional deviation and defocus (calibration curve), More specifically, FIG. 21 shows the relationship between the positional deviation and defocus when the exposure dose was varied at ratios of −10%, −5%, −1%, 0%, +1%, +5%, +10% from the central value, i.e. 7.5 mJ/cm$^2$.

As seen from the graph of FIG. 21, even if the exposure dose was varied within the range of −10% to +10%, any substantial change in defocus dependency was not recognized (each line in the graph was substantially overlapped with other lines). Therefore, even if the exposure dose was fluctuated, it was possible, according to the focus-monitoring mask of this example, to detect the magnitude of defocus with high precision.

By making use of the aforementioned mask, the processing of each lot was performed under the same exposure and development conditions as those employed in the actual device pattern. Then, several pieces of wafer were taken up from the processed lot, and the magnitude of defocus as well as the sign thereof were determined by making use of the calibration curve shown in FIG. 21 and on the basis of the relative distance between the translucent film portion and the light-shielding film portion. Then, an average value was determined from several values of focus deviation, the resultant average value being determined as a magnitude of defocus in the lot. In the exposure process of the next lot, this average value was fed back for setting the focus of the exposure apparatus. As a result, it was possible to suppress the fluctuation of line width originating from the deviation of focus.

In the foregoing embodiment, the magnitude of defocus which was derived from the aforementioned focus-monitoring pattern was employed as a feed-back data for the next lot. However, the focus point of the device pattern may not necessarily be the same as the focus point of the focus-monitoring pattern due to the aberration of the exposure apparatus or due to the stepped configuration of the underlying layer of the device pattern. If so, an off-set value which is peculiar to the device can be added to the value of deviation of focus that has been obtained from the focus-monitoring pattern, the resultant value being adopted as being the deviation value of focus and employed as a feed-back data.

In this example, the marks for detecting the focus were measured by making use of an alignment deviation inspection apparatus which is disposed independent from the exposure apparatus. However, it is also possible to employ an alignment deviation inspection function which is built in the exposure apparatus per se. Further, the focus-monitoring pattern may be of any configuration as long as it is formed of a pattern of mark that can be measured using the alignment deviation inspection apparatus. The configuration of the projected portion may not necessarily be as sharp as the distal end shown in FIG. 18D. Namely, as long as the distal end portion of the mark is made narrower than the central portion thereof, it is capable of functioning as a focus-monitoring pattern.

Further, the size and pitch of translucent film portion of the focus-monitoring pattern as well as the transmissivity of translucent film portion of the focus-monitoring pattern may not be confined to those shown in FIGS. 18A to 18D, but may be modified in various ways depending on the exposure conditions to be employed so as to improve the performance of detecting the focus.

Figure 22:
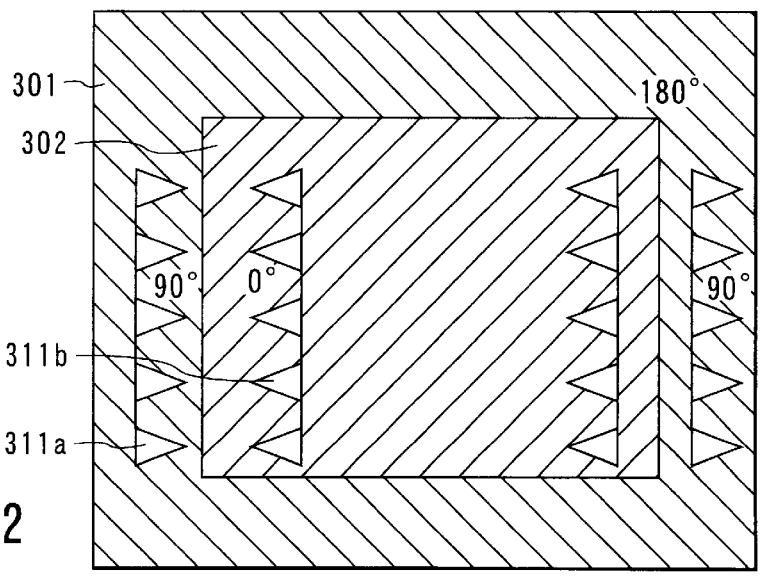
FIG. 22 is a plan view showing a modified embodiment of the focus monitor pattern according to a third example.

Further, the rectangular portion of the focus-monitoring pattern is not necessarily required. Namely, even if the focus-monitoring pattern is constituted exclusively by the tapered pattern 311 as shown in FIG. 22, it can be functioned as a focus monitor. In that case, since there is no rectangular portion, the sensitivity to the defocus would become sharp, thereby making it possible to detect the magnitude of defocus using a measuring apparatus other than the aforementioned alignment deviation inspection apparatus. Additionally, according to this example, it is possible to miniaturize the pattern, and to cope with the case where the dicing line is further narrowed.

Figure 23:
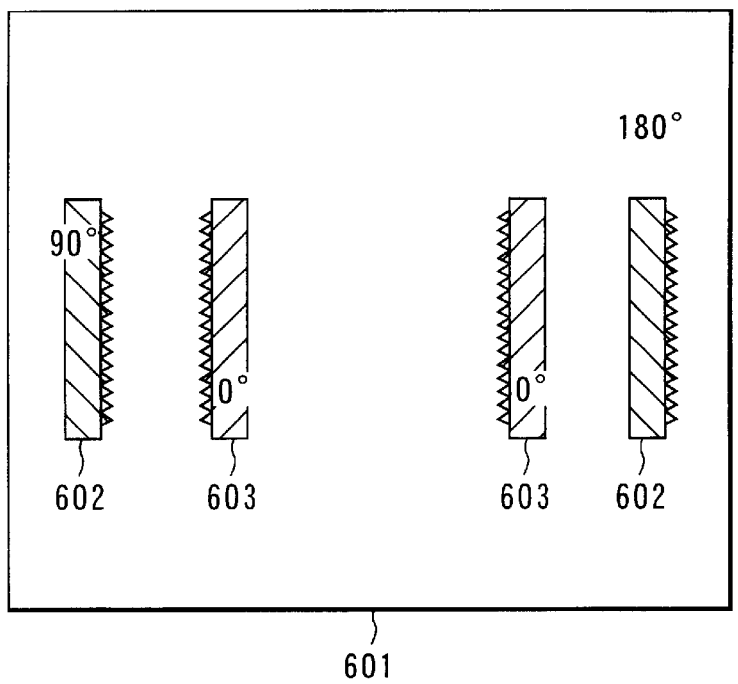
FIG. 23 is a plan view showing another modified embodiment of the focus monitor pattern according to a third example.

Moreover, the relationship between the light-shielding portion and opening portion in the first pattern region may be reversed. Namely, as shown in FIG. 23, a monitor pattern formed of a light-shielding film 603 may be formed inside the opening 601. Likewise, the relationship between the translucent film portion and opening portion in the second pattern region may be reversed. Namely, the monitor pattern formed of a translucent film 602 may be formed inside the opening 601. Even if these constructions is combined in any manner, the same effects as those obtainable in this example can be obtained.

Figure 24:
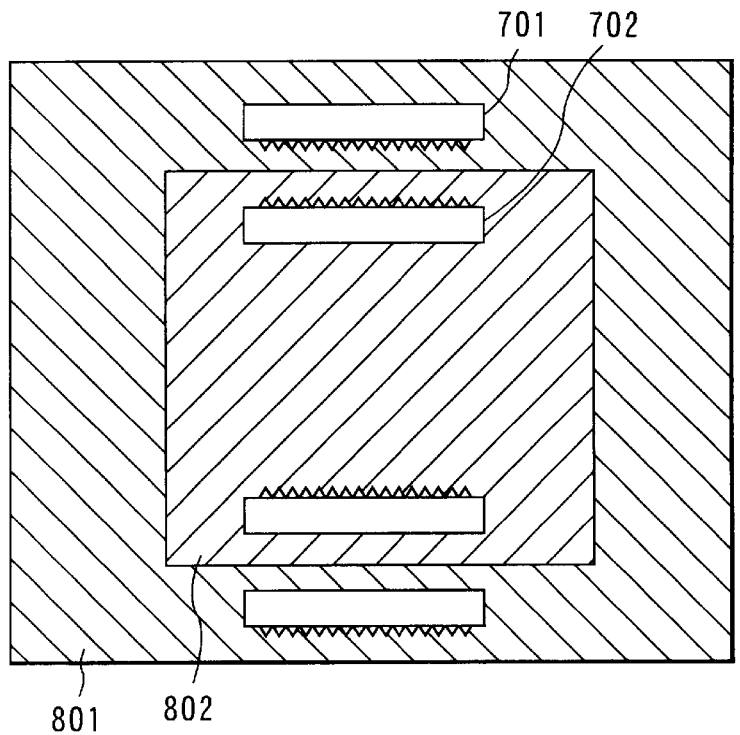
FIG. 24 is a plan view showing another modified embodiment of the focus monitor pattern according to a third example.
Figure 25:
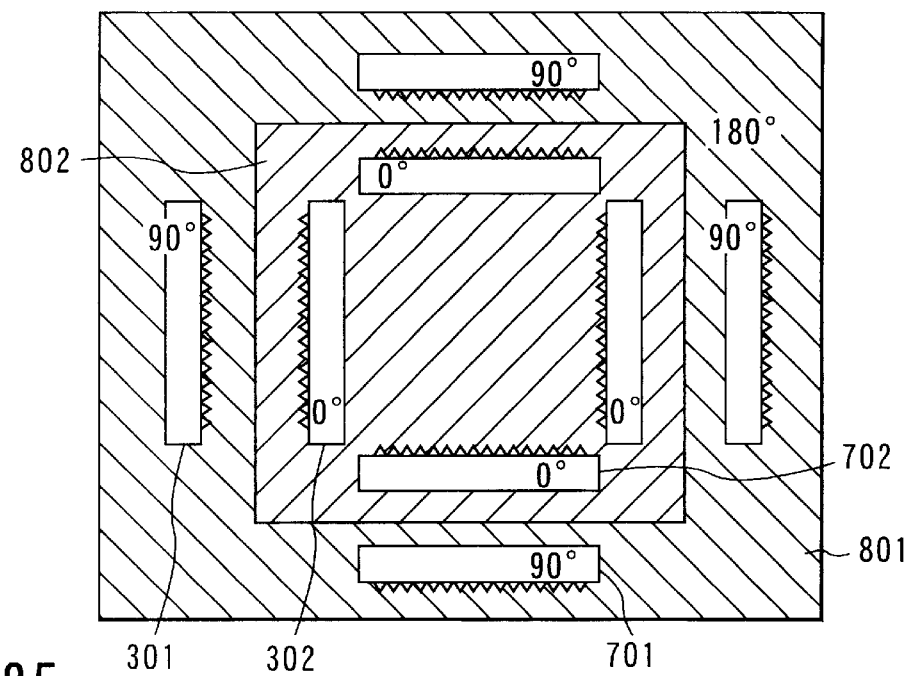
FIG. 25 is a plan view showing another modified embodiment of the focus monitor pattern according to a third example.

Although a mask having two sets of mark consisting of light-shielding film and translucent film was employed in this example, it is possible to arrange the mark in a direction which is perpendicular to the direction of mark of this example as shown in FIG. 24. Further, even if two sets of marks consisting of the marks 301 and 302 shown in FIG. 18C and the marks 701 and 702 shown in FIG. 24 are employed together as shown in FIG. 25, they can be functioned as a focus monitor.

Figure 26:
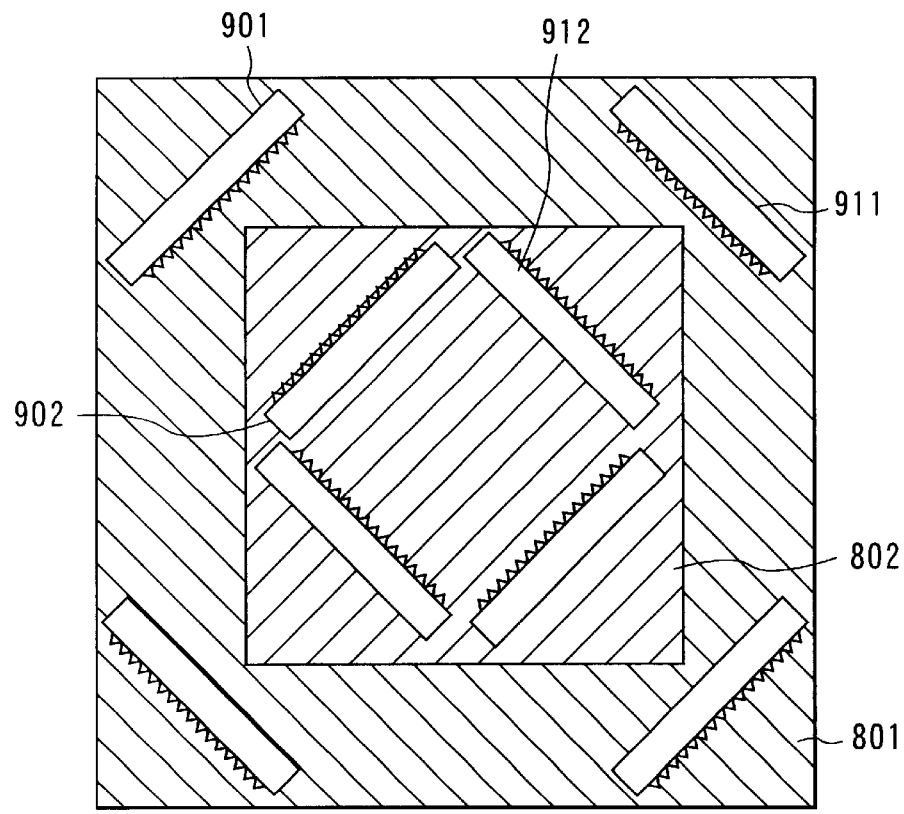
FIG. 26 is a plan view showing another modified embodiment of the focus monitor pattern according to a third example.

Further, even if the marks 301, 302, 701 and 702 shown in FIGS. 18C and 24 are inclined by an angle of 45 degrees so as to form inclined marks 901 and 902 as shown in FIG. 26, they can be functioned as a focus monitor.

Figure 27A:
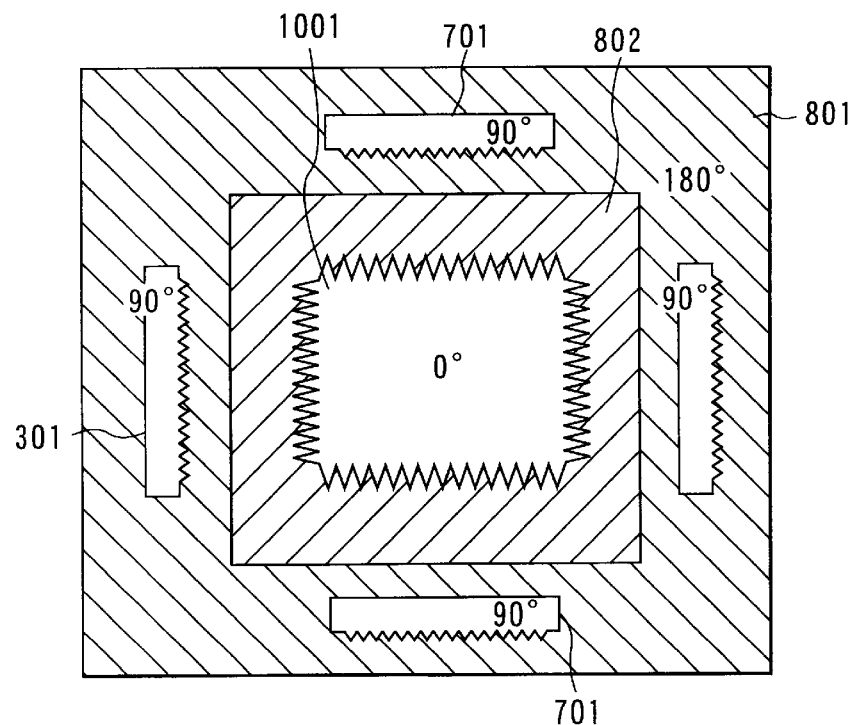
FIGS. 27A and 27B respectively shows a plan view illustrating another modified embodiment of the focus monitor pattern according to a third example.
Figure 27B:
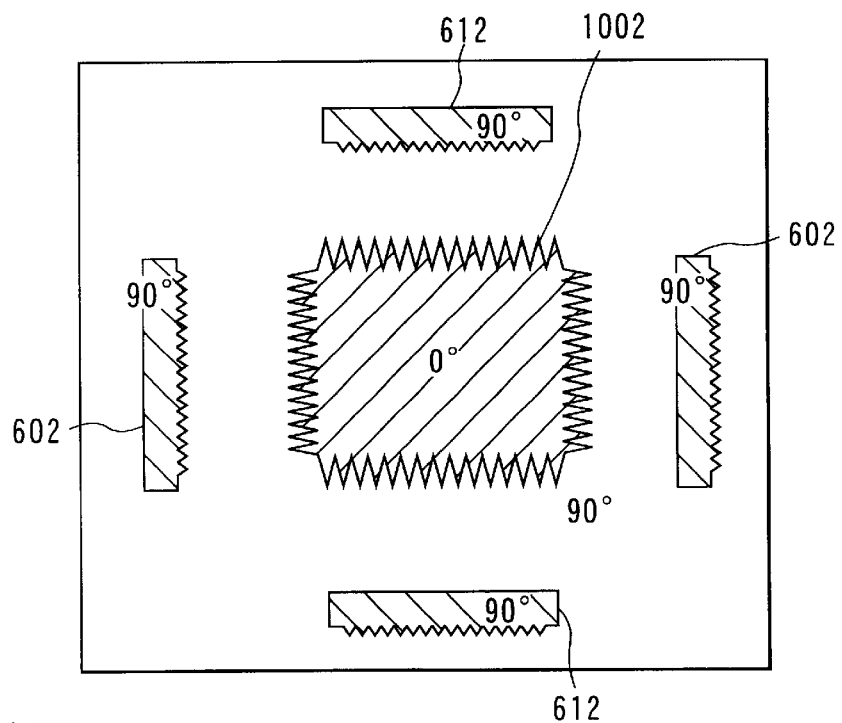

The central portion of the focus-monitoring pattern may be constituted by BOX type marks (a rectangular mark on four sides of which a tapered pattern is respectively formed) 1001 and 1002 as shown in FIGS. 27A and 27B. In this case, FIG. 27A is opposite to FIG. 27B in the relationship between the opening and the translucent film portion or the light-shielding film portion.

In the case of these BOX type marks 1001 and 1002, the distal ends of tapered patterns which are faced to each other (upper and lower sides, right and left sides) are extended in the opposite directions (symmetrical) to each other. Further, the extending direction of the projected portions of the marks 301, 701, 602 and 612 located at the periphery of the mask is opposite (symmetrical) to the extending direction of the projected portion of the mark located at the center of the mask.

Although the focus-monitoring pattern according to this example is formed on the dicing line of the mask, the location of the focus-monitoring pattern is not confined to the dicing line. Namely, as long as the focus-monitoring pattern is formed at any portion of the mask, it can be utilized as a QC mask.

In this example, a translucent film 2 exhibiting a phase difference of 180 degrees was employed and the substrate was partially etched off for the purpose of giving a phase difference of 90 degrees to the exposure light passing through the periphery of the opening relative to the exposure light passing through the opening in the translucent film portion. However, if a translucent film having a phase difference of 90 degrees is employed, the aforementioned partial etching of substrate would not be required. Further, the phase difference between the exposure light passing through the periphery of the opening and the exposure light passing through the opening may not be confined to 90 degrees, but may be optionally selected as long as it is capable of generating a variation in best focus position between the second monitor pattern 302 of the light-shielding film portion and the first monitor pattern 301 of the translucent film portion 801.

As for the materials for the translucent film, it is possible to employ molybdenum silicide oxynitride (MoSiON), molybdenum silicide nitride (MoSiN), chromium fluoride (CrF), zirconium silicide (GrSiO), etc. Further, the transmissivity of the translucent film is not limited to 6%, but may be optionally altered depending on the specification of product to obtain. According to the experiments performed by the present inventors, the transmissivity of the translucent film may be in the range of 3 to 15%.

Figure 28:
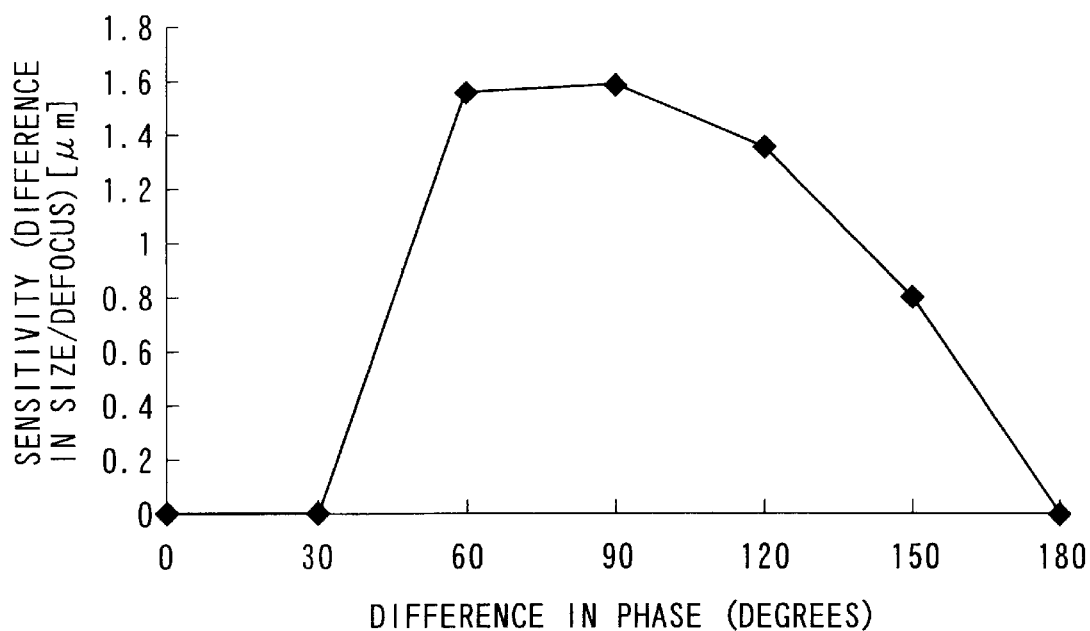
FIG. 28 is a graph explaining the relationship between the sensitivity of detecting focus and a phase difference between the translucent film portion of focus monitor pattern and the opening portion of focus monitor pattern.

FIG. 28 shows the relationship between the sensitivity of detecting focus and a phase difference between the translucent film portion and the opening of the monitor pattern. It will be seen from FIG. 28 that if the detection accuracy of focus deviation required is assumed to be 0.05 $\mu$m, and the measurement accuracy of the line width-measuring apparatus required is assumed to be 0.02 $\mu$m, the limit of detection sensitivity required for the focus monitoring would be: sensitivity (relative distance/defocus)=[L]/[$\Delta$focus]=0.4, so that the limit of detection sensitivity should be 0.4 or more. Therefore, the phase difference is required to be set within the range of 45 degrees to 150 degrees.

Fourth Example

According to this example, as a mark for measuring the focus point, a monitor pattern formed with two kinds of translucent films is disposed on the surface of the mask. The features which differ from the aforementioned third example are that the translucent film is disposed in both first and second pattern regions.

FIGS. 29A to 29D schematically illustrates the construction of a mask having a focus-monitoring pattern according to this example, wherein FIG. 29A is a cross-sectional view of the mask, FIG. 29B is a plan view of the mask, FIG. 29C is a plan view of the focus-monitoring pattern, and FIG. 29D is an enlarged plan view of the focus-monitoring pattern.

The monitor pattern is formed at a light-shielding portion of dicing line of the mask where no device pattern is formed. In these FIGS., the reference number 1 denotes a transparent substrate, 2 a translucent film, and 3 a light-shielding film. By the way, the translucent film 2 has a transmissivity of 6% to the exposure light and acts to deviate a phase of exposure light by an angle of 180 degrees.

In the first pattern region 1211 where the mark 1201 is formed, a portion of the substrate 1 which is exposed through the opening portion is partially etched (for example, 124 nm), so that the light passing through the peripheral translucent film is allowed to have a phase difference of +90 degree relative to the light passing through the mark 1201 constituting the opening. On the other hand, in the second pattern region 1212 where the second mark 1202 is formed, a portion of the substrate 1 which is exposed through the opening portion is partially etched (for example, 372 nm), so that the light passing through the peripheral translucent film 2 is allowed to have a phase difference of −90 degree relative to the light passing through the tapered pattern constituting the opening.

The mark of the opening is provided along one side of the rectangular configuration thereof with fine wedge-like tapered pattern. In FIG. 29D, a wedge-like pattern is shown as one example of the tapered pattern. Each wedge-like pattern is configured such that the length in the direction of X-axis is 6 $\mu$m, the length in the direction of Y-axis is 0.18 $\mu$m, and the pitch is 0.36 $\mu$m. In this case, the distal end of the pattern is directed in the same direction in the first pattern region 1211 (the second pattern region 1212), while in the first pattern region 1211 and the second pattern region 1212, the distal end of the pattern is directed in the opposite direction (symmetrically) so as to face to each other.

In this third example, it was indicated that the difference (positional deviation) of the center of mark which was formed on a wafer through a patterning of the light-shielding film portion and translucent film portion by making use of a mask having a pattern was caused to monotonically decrease or increase in proportion to the defocus.

Therefore, with a view to further improve the detection sensitivity of the magnitude of defocus, it has been proposed by the present inventors to shift the phase of exposure light passing through the translucent film 2 by an angle of +90 degrees relative to the phase of exposure light passing through the mark 1201 in the first pattern region 1211, and to shift the phase of exposure light passing through the translucent film 2 by an angle of about −90 (270) degrees relative to the phase of exposure light passing through the mark 1202 in the second pattern region. As a result, the magnitude of deviation between the focus point of the mark 1201 of translucent film portion where the phase of the exposure light passing through the opening was shifted by an angle of about +90 degrees and the focus point of the mark formed in the light-shielding film portion was changed by a magnitude described in the first example.

Whereas, the focus point of the mark 1202 of translucent film portion 2 where the phase of the exposure light passing through the second mark 1202 was shifted by an angle of about −90 degrees exhibited the same absolute value of deviation described in the first example and the opposite sign (+, −) relative to the focus point of the mark formed in the light-shielding film portion. As a result, it is possible to improve the detection sensitivity of magnitude of defocus which is twice as high as that of the third example.

Next, the procedures for detecting the focus point by making use of the sample prepared using the aforementioned mask will be explained. The wafer on which a mask having the aforementioned mark was subjected to an exposure process under the same condition as that of the device pattern. Specifically, a coating type reflection preventive film having a thickness of 60 nm was formed on a wafer by means of spin coating, and then, a chemical amplification type positive resist was spin-coated to a thickness of 0.4 μm.

Then, by making use of the aforementioned mask, the wafer was subjected to exposure under the conditions of: 1/4 in reduction ratio of projecting optical system, 248 nm in exposure light wavelength, 0.6 in NA, 0.75 in coherence factor σ, 0.67 in ring zone shielding factor ε, and 7.5 mJ/cm$^2$ in exposure dosage set in the exposure apparatus.

After finishing the exposure, the wafer was subjected to a post exposure baking (PEB) at a temperature of 100° C., which was followed by the development thereof for 60 seconds using an alkaline developing solution of 0.21N.

Then, the difference of the central position of these two groups of patterns formed on this developed wafer was measured using an alignment-measuring apparatus.

Figure 30:
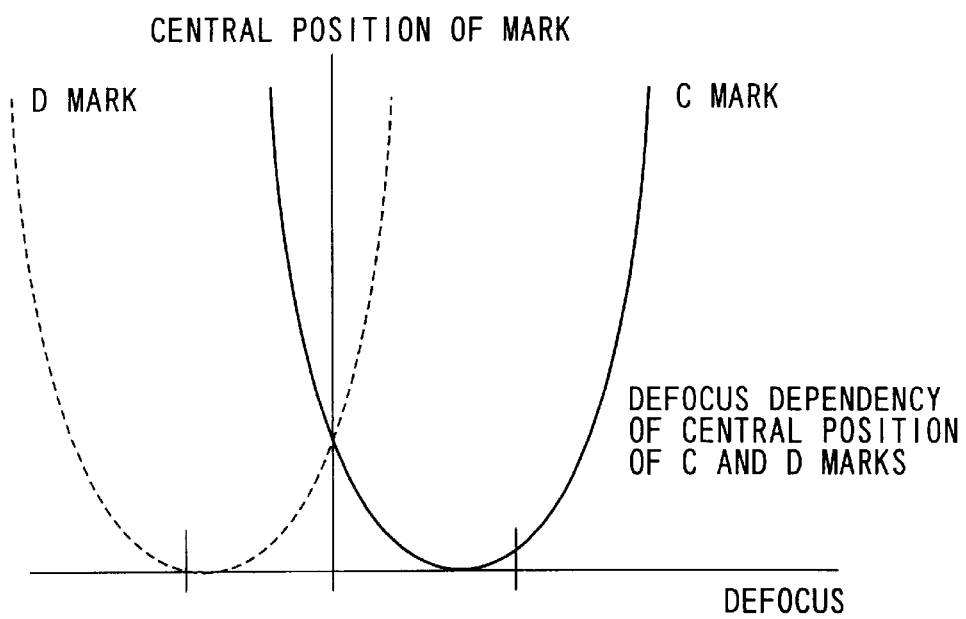
FIG. 30 is a graph illustrating the relationship between the central position of the mark portion and defocus.

FIG. 30 shows the relationship between the defocus and the central position of two marks. The abscissa in this graph represents the defocus, and the ordinate represents the center position. Among these three curves shown therein, the solid line represents the dimensional characteristic of pattern that has been transferred on the wafer through the mark (mark C) formed in the translucent film portion whose phase difference relative to the opening is +90, and the dotted line represents the dimensional characteristic of pattern that has been transferred on the wafer through the mark (mark D) formed in the translucent film portion whose phase difference relative to the opening is −90.

Figure 31:
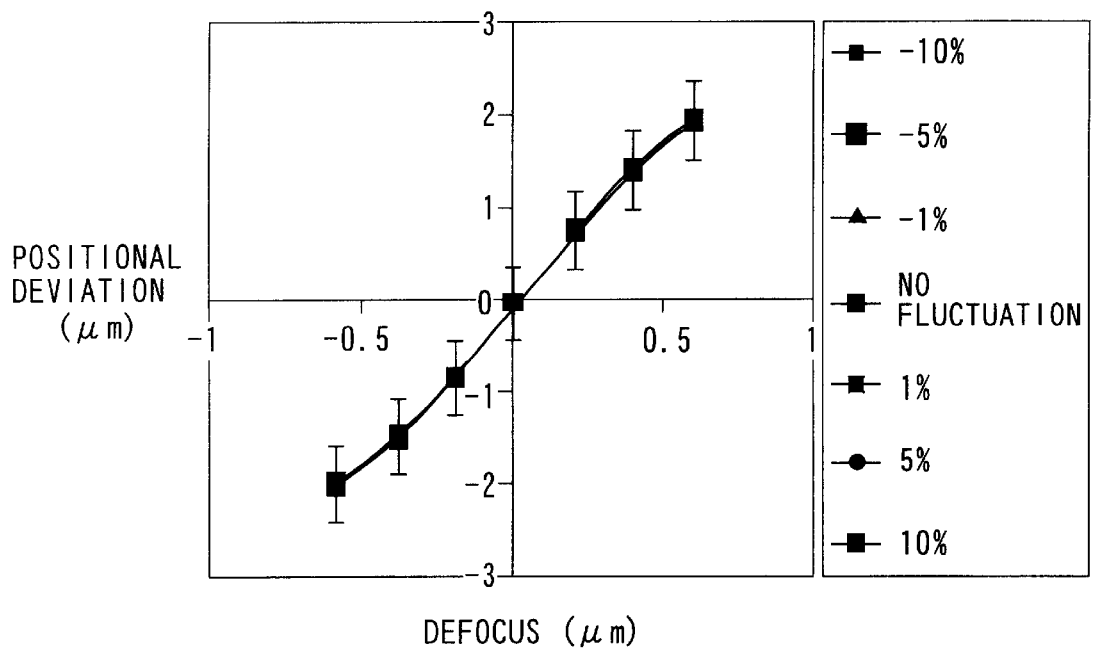
FIG. 31 is a graph illustrating the relationship between defocus and the magnitude of dislocation of the pattern that has been obtained by transferring the focus monitor pattern shown in FIG. 29C on a wafer.

FIG. 31 illustrates the magnitude of deviation (calibration curve) between the pattern which was transferred on the wafer through the mark 1201 formed in the translucent film portion whose phase difference relative to the opening is +90 degrees and the pattern which was transferred on the wafer through the second mark 1202 formed in the translucent film portion whose phase difference relative to the opening is −90 degrees. It has been found from these results that the detection sensitivity of the magnitude of defocus can be increased by about twice as high as that of the first example.

Additionally, the exposure dose was varied on the occasion of exposure so as to investigate the dose dependency of calibration curve. Specifically, the exposure was performed while varying the exposure dose in the range of −10% to +10% from the central value thereof which was set to 7.5 mJ/cm$^2$. FIG. 31 shows the dose dependency of the relationship between the magnitude of positional deviation and the defocus (calibration curve). More specifically, FIG. 31 shows the relationship between the magnitude of positional deviation and the defocus when the exposure dose was varied at ratios of −10%, −5%, −1%, 0%, +1%, +5%, +10% from the central value, i.e. 7.5 mJ/cm$^2$.

As seen from the graph of FIG. 31, even if the exposure dose was varied within the range of −10% to +10%, any substantial change in defocus dependency was not recognized (each line in the graph was substantially overlapped with other lines). Therefore, even if the exposure dose was fluctuated, it was possible, according to this example also, to detect the magnitude of defocus with high precision.

By making use of the aforementioned mask, the processing of each lot was performed under the same exposure and development conditions as those employed in the actual device pattern. Then, several pieces of wafer were taken up from the processed lot, and a relative distance between the mark in the translucent film portion and the mark in the light-shielding film portion was determined. Based on this relative distance thus obtained, the magnitude of defocus was determined together with the sign (+, −) thereof by making use of the calibration curve shown in FIG. 31. Then, an average value was determined from several values of focus deviation, the resultant average value being determined as a magnitude of defocus in the lot. In the exposure process of the next lot, this average value was fed back for setting the focus of the exposure apparatus. As a result, it was possible to suppress the fluctuation of line width originating from the deviation of focus.

In the foregoing embodiment, the magnitude of defocus in the pattern on the surface of wafer that has been obtained from the aforementioned focus-monitoring mask was employed as a feed-back data for the next lot. However, the focus point of the device pattern may not necessarily be the same as the focus point of the focus-monitoring mark due to the aberration of the exposure apparatus or due to the stepped configuration of the underlying layer of the device pattern. If so, an off-set value which is peculiar to the device can be added to the value of deviation of focus that has been obtained from the focus-monitoring mask, the resultant value being adopted as being the deviation value of focus and employed as a feed-back data.

In this example, the marks for detecting the focus were measured by making use of an optical type alignment deviation inspection apparatus which is disposed independent from the exposure apparatus. However, it is also possible to employ an alignment deviation inspection function which is built in the exposure apparatus per se or to employ an alignment deviation inspection apparatus of non-optical type. Further, the focus-monitoring pattern may be of any configuration as long as it is formed of a pattern of mark that can be measured using the alignment deviation inspection apparatus. The configuration of the projected portion may not necessarily be as sharp as the distal end shown in FIG. 29D. Namely, as long as the distal end portion of the mark is made narrower than the central portion thereof, it is capable of functioning as a focus-monitoring pattern.

Further, the size and pitch of translucent film portion of the focus-monitoring pattern as well as the transmissivity of translucent film portion of the focus-monitoring pattern may not be confined to those shown in FIGS. 29A to 29D, but may be modified in various ways depending on the exposure conditions to be employed so as to improve the performance of detecting the focus.

Figure 32:
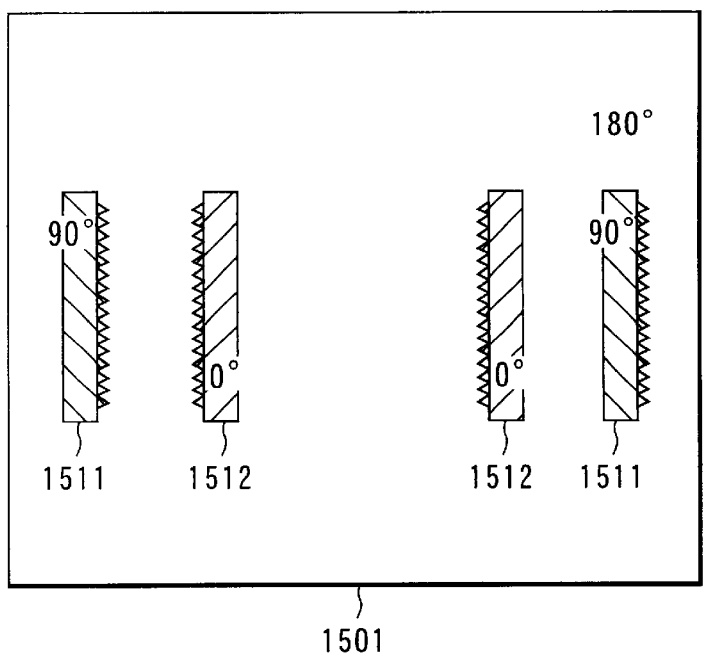
FIG. 32 is a plan view showing a modified embodiment of the focus monitor pattern according to a fourth example.

Moreover, the relationship between the light-shielding portion and opening portion in the first pattern region may be reversed. Namely, as shown in FIG. 32, the monitor pattern formed of a translucent film 1511 is surrounded by the opening 1501. Likewise, the relationship between the translucent film portion and opening portion in the second pattern region may be reversed. Namely, the monitor pattern formed of a light-shielding film and a translucent film 1512 may be surrounded by the opening 1501. Even if these constructions is combined in any manner, the same effects as those obtainable in this example can be obtained.

Figure 33:
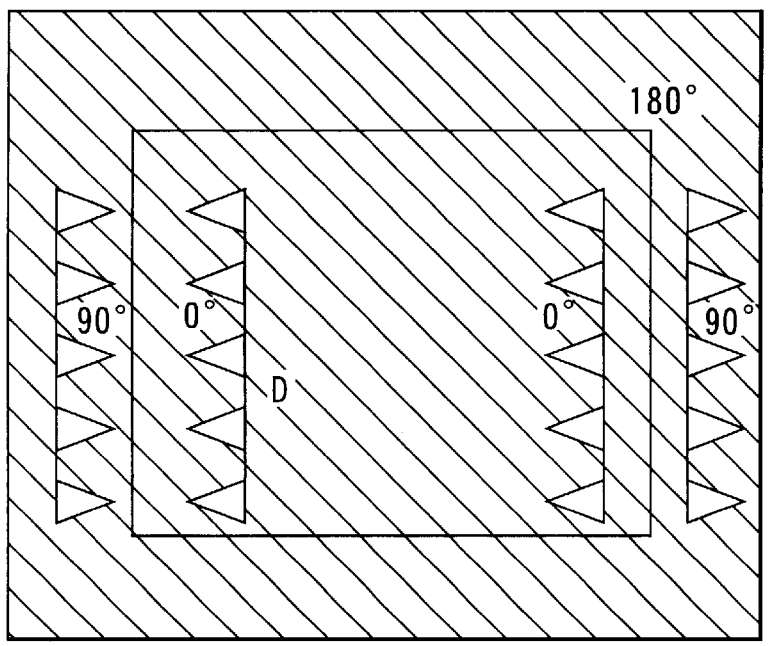
FIG. 33 is a plan view showing another modified embodiment of the focus monitor pattern according to a fourth example.

Further, the rectangular portion of the focus-monitoring pattern is not necessarily required. Namely, even if the focus-monitoring pattern is constituted exclusively by the tapered pattern 311 as shown in FIG. 33, it can be functioned as a focus monitor.

Figure 34:
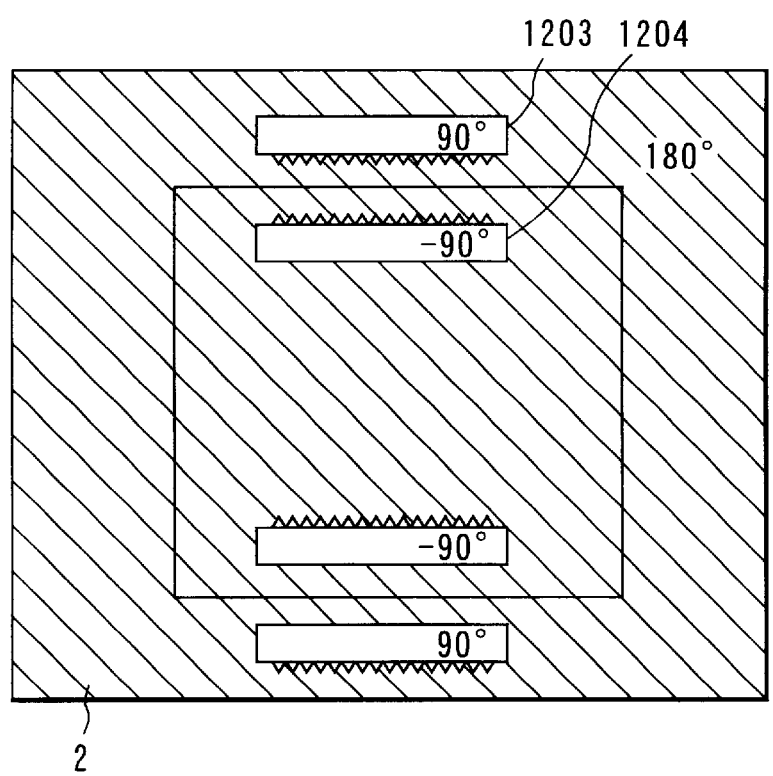
FIG. 34 is a plan view showing another modified embodiment of the focus monitor pattern according to a fourth example.

Although a mask having two sets of mark consisting of light-shielding film and translucent film was employed in this example, it is possible to arrange the marks 1203 and 1204 in a direction which is perpendicular to the direction of mark of this example as shown in FIG. 34. Further, even if two sets of marks consisting of the marks 1201, 1202, 1203 and 1204 are employed as shown in FIG. 35, they can be functioned as a focus monitor.

Figure 35:
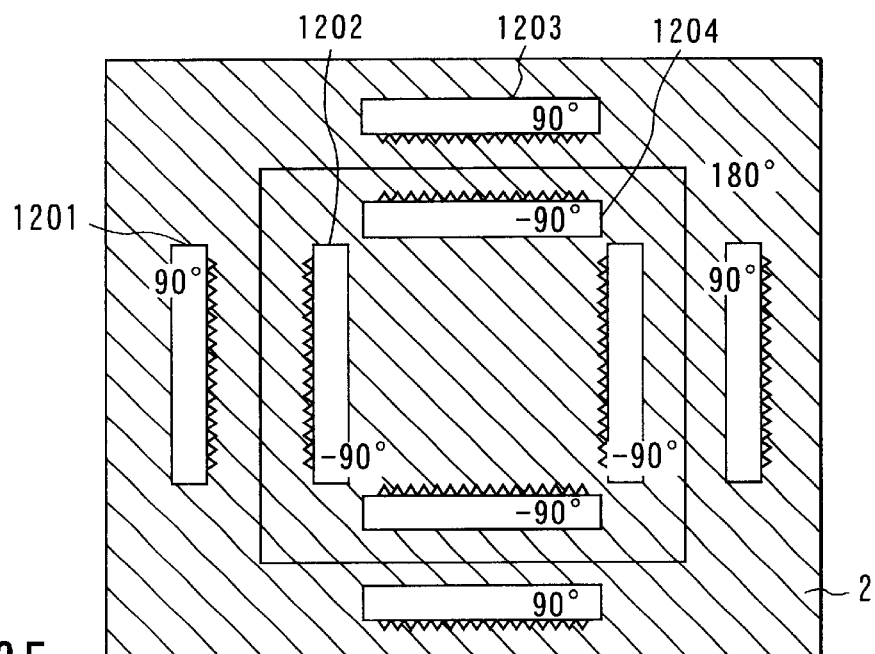
FIG. 35 is a plan view showing another modified embodiment of the focus monitor pattern according to a fourth example.
Figure 36:
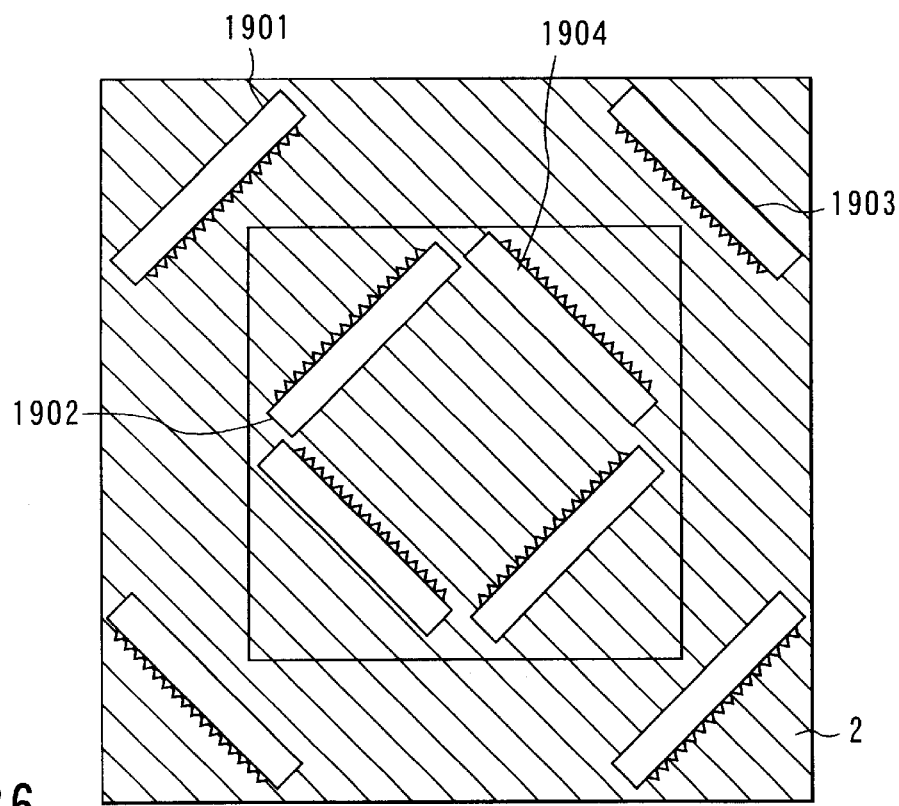
FIG. 36 is a plan view showing another modified embodiment of the focus monitor pattern according to a fourth example.

Further, even if the marks shown in FIG. 35 are inclined by an angle of 45 degrees so as to form inclined marks 1901, 1902, 1903 and 1904 as shown in FIG. 36, they can be functioned as a focus monitor.

Figure 37A:
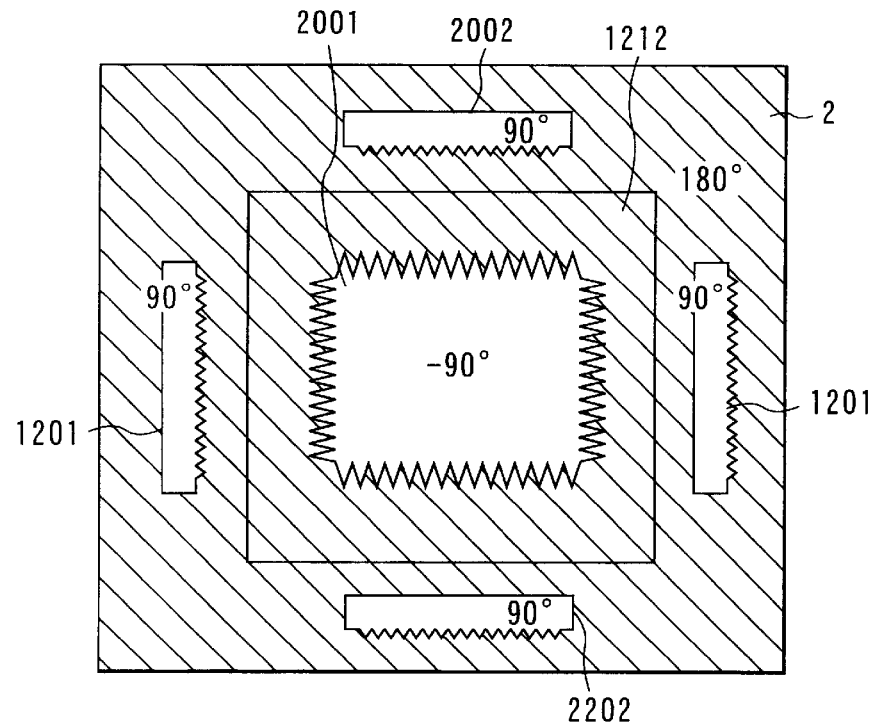
FIGS. 37A and 37B respectively shows a plan view illustrating another modified embodiment of the focus monitor pattern according to a fourth example.
Figure 37B:
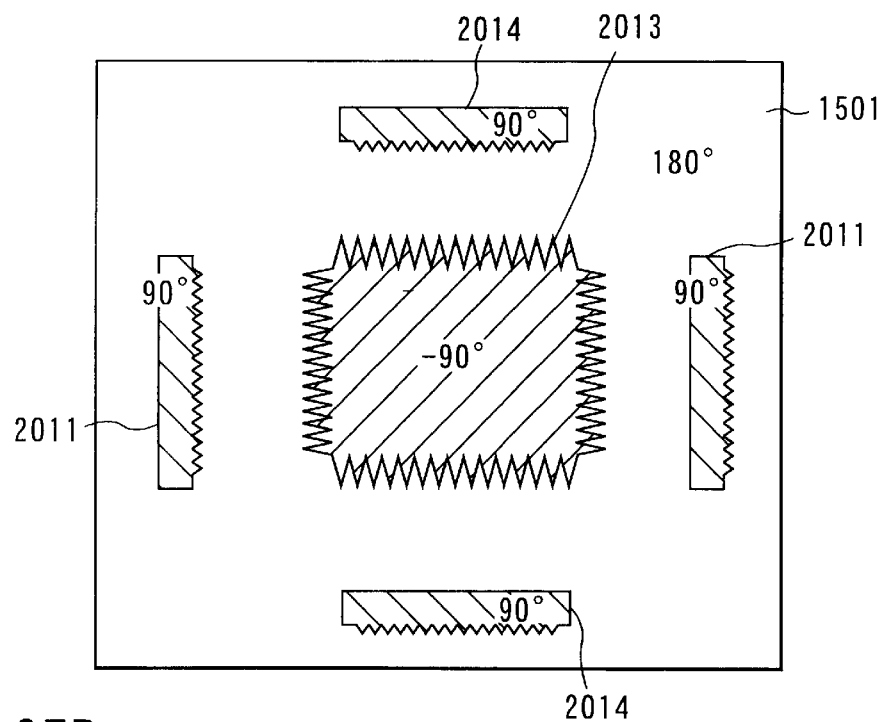
Figure 38A:
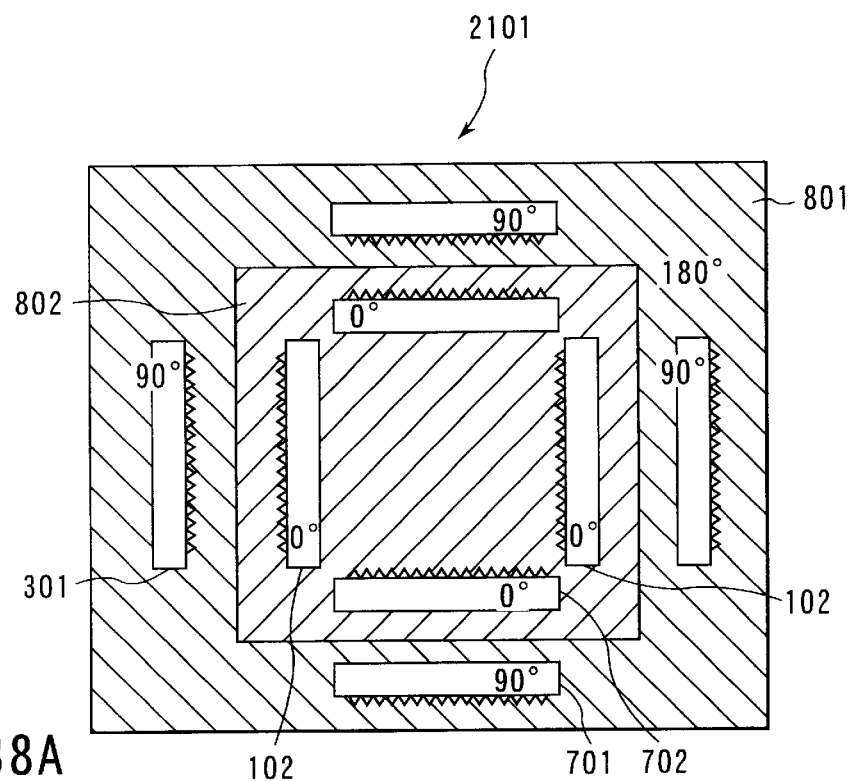
FIGS. 38A and 38B respectively shows a plan view illustrating construction of the focus monitor pattern according to a fifth example.
Figure 38B:
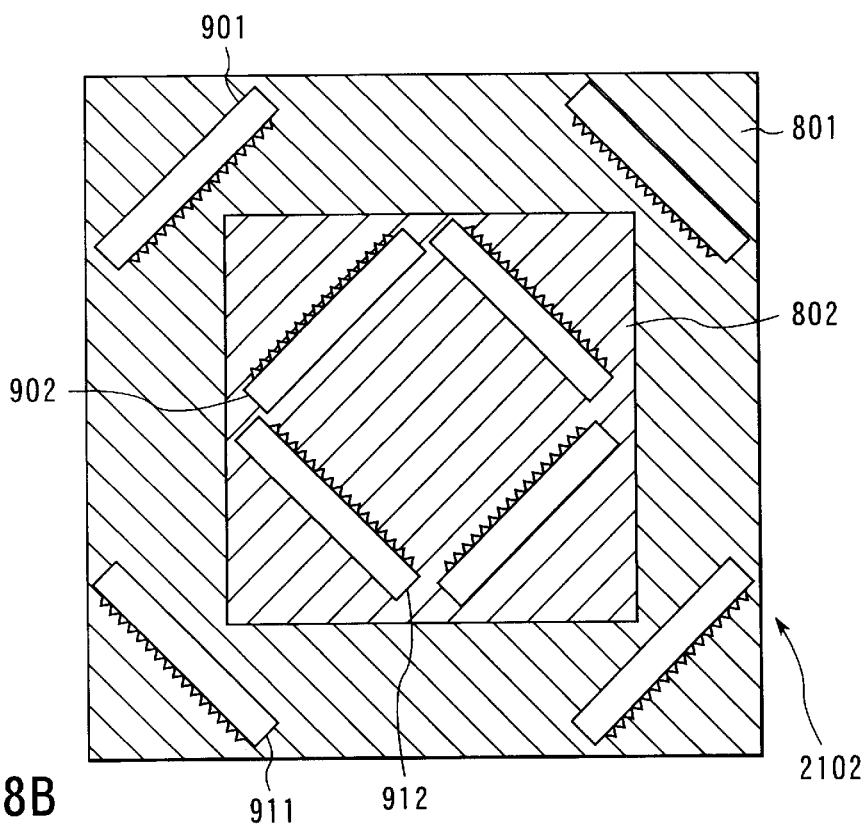
Figure 39A:
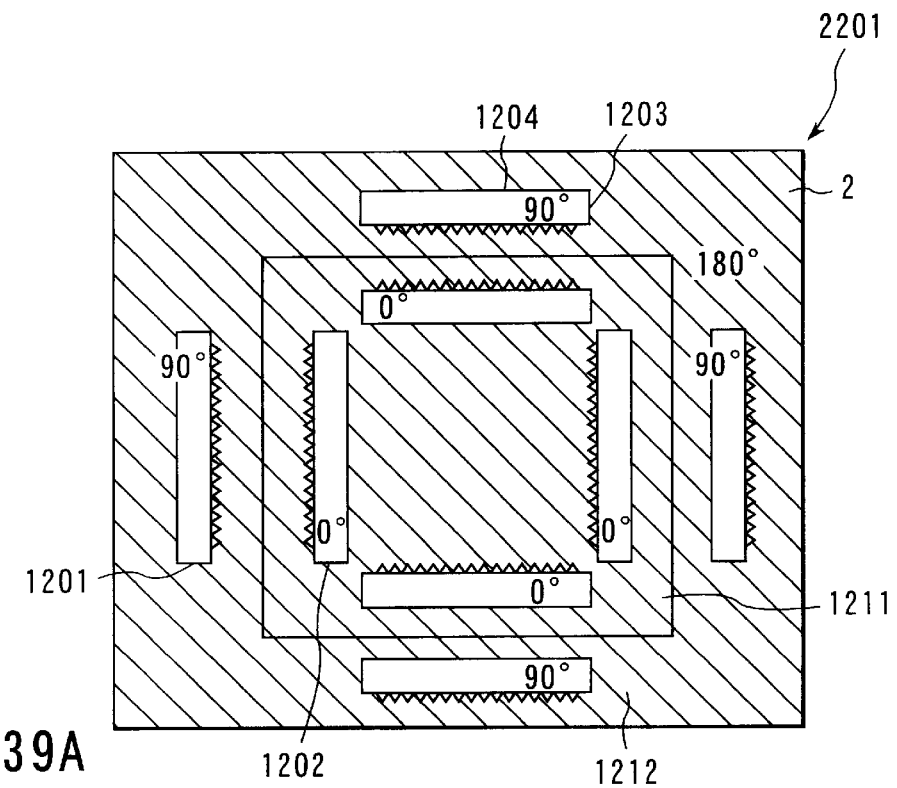
FIGS. 39A and 39B respectively shows a plan view illustrating construction of the focus monitor pattern according to a fifth example.
Figure 39B:
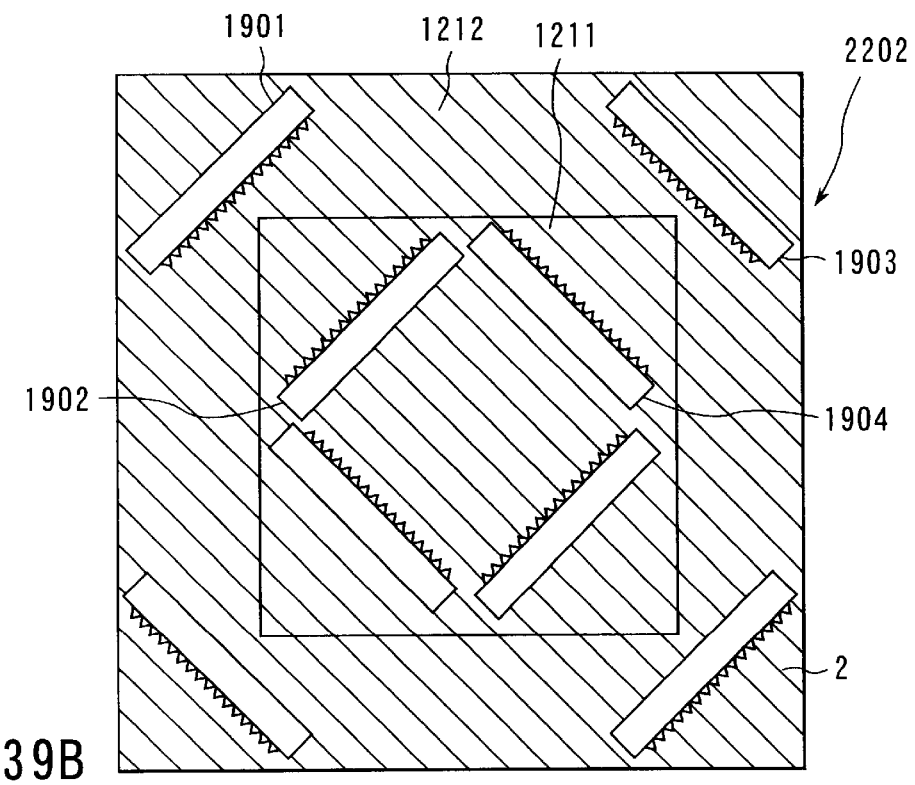

The central portion of the focus-monitoring pattern may be constituted by BOX type marks 2001 and 2002 as shown in FIGS. 37A and 37B. In this case, BOX type marks 2001 and 2002 are arranged such that the extending directions of the projected portions on opposite sides are directed away from each other or opposite to each other (symmetrically). Further, the extending direction of the tip end of tapered patterns of the marks 1201, 2002, 2011 and 2014 located at the periphery of the mask is opposite (symmetrical) to the extending direction of the tip end of tapered patterns of the marks 2001 and 2013 located at the center of the mask. Since the area of the central box is relatively large, the working of mask for forming the fine marks through several steps can be alleviated.

Although the focus-monitoring pattern according to this example is formed on the dicing line of the mask, the location of the focus-monitoring pattern is not confined to the dicing line. Namely, as long as the focus-monitoring pattern is formed at any portion of the mask, it can be utilized as a QC mask.

According to the aforementioned first embodiment of the present invention, a couple of regions, i.e. the first and second pattern regions each having a monitor pattern are prepared, and a deviation is caused to generate in the best focus position between the monitor pattern of the first pattern region and the monitor pattern of the second pattern region, thereby giving a different defocus characteristic from each other, so that by measuring the magnitude of dislocation of this couple of monitor patterns, the magnitude as well as direction of deviation from the best focus state can be determined.

In this example, the same translucent film was employed for both first pattern region and second pattern region, and the etching magnitude of the transparent substrate of the opening portion is altered to bring about a difference in phase difference between the first pattern region and the second pattern region. Instead, the first and second pattern regions may be constituted by a different kind of translucent film, respectively.

Fifth Example

In this example, a mask constituted by two kinds of monitor patterns was employed for investigating the direction dependency of focus due to a low order aberration. The masks shown in FIGS. 38A, 38B, 39A and 39B are formed of either one group of marks 2101 and 2201, or the other group of marks 2102 and 2202 whose arraying direction is rotated by an angle of plus or minus 45 degrees relative to the direction of the tip end of the tapered pattern of the marks 2101 and 2201.

If there is an aberration in the optical lens of exposure apparatus, a directivity is caused to generate in the focus point of the device pattern. Namely, the focus point would be altered depending on whether the device pattern is parallel with the X-direction or the device pattern is parallel with the Y-direction. Therefore, a best focus point should be preliminarily investigated with respect to the angles related to the low order aberration, i.e. 0 degree, 90 degrees, +45 degrees and –45 degrees, and then a difference in position of best focus is fed back in advance as an off-set value to the exposure apparatus, thereby making it possible to eliminate the direction dependency of the focus point due to the aberration.

Figure 40:
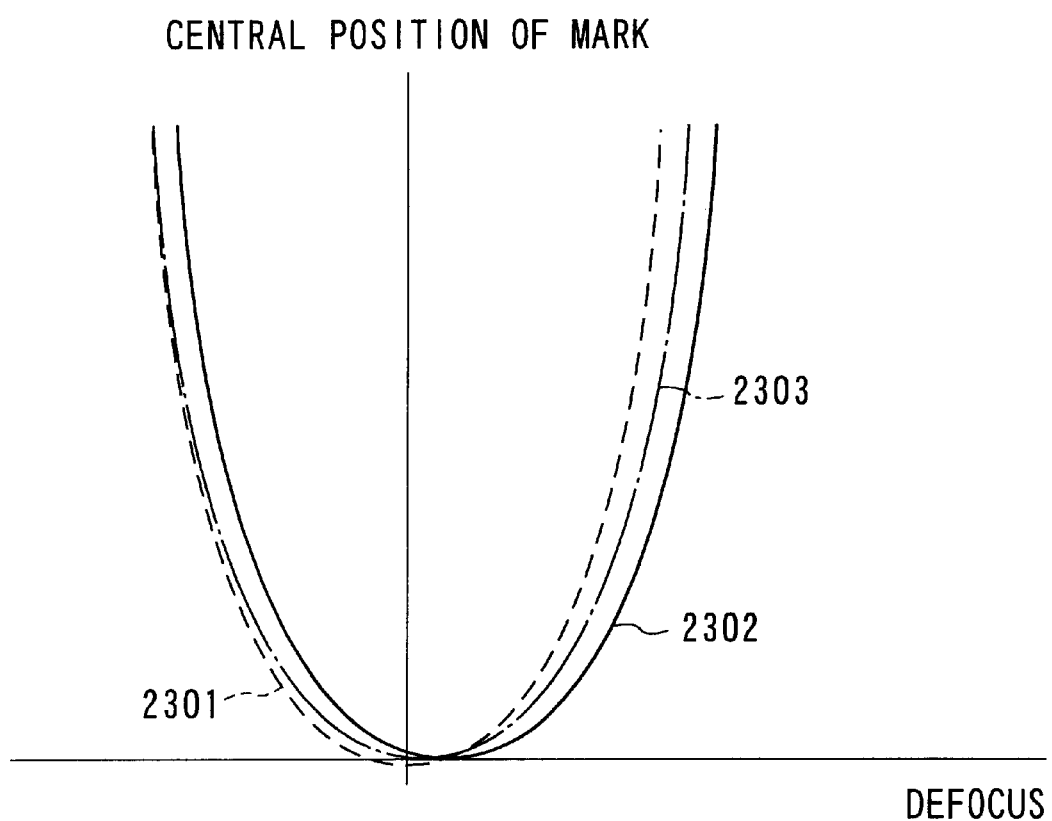
FIG. 40 is a graph showing defocus dimension curves of monitor patterns directed at an angle of 0 degree, 90 degrees, +45 degrees and −45 degrees.

As explained above, the curves of defocus value at angles of 0 degree, 90 degrees, +45 degrees and –45 degrees become as shown in FIG. 40. In FIG. 40, the reference number 2301 represents the characteristics of defocus value of the mark at an angle of 0 degree, the reference number 2302 represents the characteristics of defocus value of the mark at an angle of plus/minus 45 degrees and the reference number 2303 represents the characteristics of defocus value of the mark at an angle of 90 degrees. It will be seen from these results that when a best focus point is preliminarily investigated with respect to each angle, and then the difference obtained is off-set, it becomes possible to eliminate a deviation of focus due to the aberration.

As explained above, according to the second embodiment of the present invention, a couple of regions, i.e. the first and second pattern regions each having a monitor pattern are prepared, and a deviation is caused to generate in the best focus position between the monitor pattern of the first pattern region and the monitor pattern of the second pattern region, thereby giving a different defocus characteristic from each other, so that by measuring the magnitude of dislocation of this couple of monitor patterns, the magnitude as well as direction of deviation from the best focus state can be easily determined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A focus-monitoring mask which is adapted to be employed on an occasion of transferring a pattern on a wafer by way of photolithography, said focus-monitoring mask comprising:

a first pattern region having at least one first monitor pattern which is constituted by a first opening surrounded by a first film or constituted by the first film surrounded by the first opening; and a second pattern region having at least one second monitor pattern which is constituted by a second opening surrounded by a second film or constituted by the second film surrounded by the second opening, and is capable of giving a phase difference to an exposure light passing through said second film relative to an exposure light passing through said second opening;

wherein said first and second monitor patterns have a configuration in which the both ends thereof are tapered from a central portion thereof.

2. The focus-monitoring mask according to claim 1, wherein said first film is a light-shielding film, and said second film is a translucent film.

3. The focus-monitoring mask according to claim 1, wherein said phase difference of exposure light passing through said second film relative to an exposure light passing through said second opening is set to the range of from +45 degrees to +150 degrees or to the range of from –45 degrees to –150 degrees.

4. The focus-monitoring mask according to claim 1, wherein said first and second monitor patterns have a wedge-like or rhomboid configuration.

5. A method for focus monitoring which is designed to monitor a magnitude of deviation from a best focus state on an occasion of transferring a pattern on a wafer by way of photolithography, said method comprising the steps of:

transferring a pattern on a wafer by making use of the focus-monitoring mask as claimed in claim 1;

measuring the sizes of the first and second monitor patterns among the patterns formed on the wafer; and calculating, on the basis of the sizes measured, a difference or ratio between the size of the first monitor pattern and the size of the second monitor pattern.

6. The method for focus monitoring according to claim 5, wherein said first and second monitor patterns have a rhomboid configuration, and said measuring step is designed to measure the length of one of the diagonal lines of said monitor pattern, which is longer than the other.

7. A focus-monitoring mask which is adapted to be employed on an occasion of transferring a pattern on a wafer by way of photolithography, said mask comprising;

a first pattern region having at least one first monitor pattern which is constituted by a first opening surrounded by a first film or constituted by the first film surrounded by the first opening, and is capable of giving a first phase difference to an exposure light passing through said first film relative to an exposure light passing through said first opening; and a second pattern region having at least one second monitor pattern which is constituted by a second opening surrounded by a second film or constituted by the second film surrounded by the second opening, and is capable of giving a second phase difference to an exposure light passing through said second film relative to an exposure light passing through said second opening, said second phase difference being different from said first phase difference;

wherein said first and second monitor patterns have a configuration in which both ends thereof are tapered from a central portion thereof.

8. The focus-monitoring mask according to claim 7, wherein said first and second film are both formed of a translucent film.

9. The focus-monitoring mask according to claim 7, wherein said first phase difference is set to the range of from +45 degrees to +150 degrees, while said second phase difference is set to the range of from −45 degrees to −150 degrees.

10. The focus-monitoring mask according to claim 7, wherein said first and second monitor patterns have a wedge-like or rhomboid configuration.

11. A method for focus monitoring which is designed to monitor a magnitude of deviation from a best focus state on an occasion of transferring a pattern on a wafer by way of photolithography, said method comprising the steps of;

transferring a pattern on a wafer by making use of the focus-monitoring mask as claimed in claim 7;

measuring the sizes of the first and second monitor patterns among the patterns formed on the wafer; and calculating, on the basis of the sizes measured, a difference or ratio between the size of the first monitor pattern and the size of the second monitor pattern.

12. The method for focus monitoring according to claim 11, wherein said first and second monitor patterns have a rhomboid configuration, and said measuring step is designed to measure the length of one of the diagonal lines of said monitor pattern, which is longer than the other.

13. A focus-monitoring mask which comprises;

a first pattern region having at least one first tapered monitor pattern which is constituted by a first film surrounded by a first opening or constituted by the first opening surrounded by the first film; and a second pattern region having at least one second tapered monitor pattern which is constituted by a second opening surrounded by a second film or constituted by the second film surrounded by the second opening, said second tapered monitor pattern tapering in a direction which is opposite to a tapering direction of said first tapered monitor pattern;

wherein a phase of exposure light passing through said second tapered monitor pattern differs from a phase of exposure light passing through said first tapered monitor pattern.

14. The focus-monitoring mask according to claim 13, wherein said first film is a light-shielding film, and said second film is a translucent film which is capable of causing a phase of exposure light passing therethrough to differ from a phase of exposure light passing through said second opening.

15. The focus-monitoring mask according to claim 13, wherein said phase difference of exposure light passing through said second film relative to an exposure light passing through said second opening is set to the range of from +45 degrees to +150 degrees or to the range of from −45 degrees to −150 degrees.

16. The focus-monitoring mask according to claim 13, wherein said first film and said second film are both formed of the same translucent film which enables an exposure light of the same phase to pass therethrough, and a phase difference of exposure light passing through said first film relative to an exposure light passing through said first opening differs from a phase difference of exposure light passing through said second film relative to an exposure light passing through said second opening.

17. The focus-monitoring mask according to claim 13, wherein said phase difference of exposure light passing through said first and second films relative to an exposure light passing through said first and second openings is set to the range of from +40 degrees to +165 degrees or to the range of from −40 degrees to −165 degrees.

18. The focus-monitoring mask according to claim 13, wherein the phase of exposure light passing through said first film is the same with the phase of exposure light passing through said second opening, and the phase of exposure light passing through said second film differs from the phase of exposure light passing through said second opening.

19. The focus-monitoring mask according to claim 13, wherein said focus monitor pattern is constituted by the first and second monitor patterns which are arrayed in one direction, and by the first and second monitor patterns which are arrayed in a direction perpendicular to said one direction.

20. The focus-monitoring mask according to claim 19, wherein said focus monitor pattern further comprises first and second monitor patterns which are arrayed and inclined by plus or minus 45 degrees to said one direction.

21. The focus-monitoring mask according to claim 13, wherein said first pattern region is surrounded by said second pattern region;

said second monitor pattern is constituted by a rectangular second opening or second film, every sides thereof being provided with the tapered pattern; and a tip end of the tapered pattern of said second monitor pattern is directed opposite to a direction of a tip end of the tapered pattern of said first monitor pattern.

22. The focus-monitoring mask according to claim 13, wherein said monitor patterns are formed at a dicing region where a device pattern is not disposed.

23. The focus-monitoring mask according to claim 13, wherein said monitor patterns are formed outside a dicing region.

24. The focus-monitoring mask according to claim 13, wherein said tapered pattern of each of said monitor patterns has a wedge-like or rhomboid configuration.

25. A method for focus monitoring which is designed to monitor a magnitude of deviation from a best focus state on an occasion of transferring a pattern on a wafer by way of photolithography, said method comprising the steps of;

transferring a pattern on a wafer by making use of a focus-monitoring mask which comprises a first pattern region having at least one first tapered monitor pattern which is constituted by a first film surrounded by a first opening or constituted by the first opening surrounded by the first film; and a second pattern region having at least one second tapered monitor pattern which is constituted by a second opening surrounded by a second film or constituted by the second film surrounded by the second opening, said second tapered monitor pattern tapering in a direction which is opposite to a tapering direction of said first monitor pattern; wherein a phase of exposure light passing through said second monitor pattern differs from a phase of exposure light passing through said first monitor pattern;

measuring a relative position between the first and second monitor patterns among the patterns formed on the wafer; and calculating, on the basis of the relative position measured, a deviation of the relative position of focus.

26. A method for focus monitoring which is designed to monitor a magnitude of deviation from an best focus state on an occasion of transferring a pattern on a wafer by way of photolithography, said method comprising the steps of;

transferring a pattern on a wafer by making use of a focus-monitoring mask having four groups of focus monitor pattern each group of focus monitor pattern comprising a first pattern region having at least one first tapered monitor pattern which is constituted by a first film surrounded by a first opening or constituted by the first opening surrounded by the first film; and a second pattern region having at least one second tapered monitor pattern which is constituted by a second opening surrounded by a second film or constituted by the second film surrounded by the second opening, said second tapered monitor pattern tapering in a direction which is opposite to a tapering direction of said first tapered monitor pattern; wherein a phase of exposure light passing through said second tapered monitor pattern differs from a phase of exposure light passing through said first tapered monitor pattern, and said four groups of focus monitor pattern are designed such that a direction of distal end of said tapered pattern is set to an angle of 0 degree, +45 degrees, −45 degrees and 90 degrees, respectively;

measuring a relative position between the monitor patterns of the first and second pattern regions among the patterns formed on the wafer; and correcting, on the basis of the relative position measured, a deviation of focus that is resulted from an aberration of irradiation optical lens.

* * * * *

UNITED STATES PATENT AND TRADEMARK OFFICE
CERTIFICATE OF CORRECTION

PATENT NO.   : 6,440,616 B1
DATED        : August 27, 2002
INVENTOR(S)  : Izuha et al.

It is certified that error appears in the above-identified patent and that said Letters Patent is hereby corrected as shown below:

Column 29,
Line 15, "comprising;" should read -- comprising: --.
Line 50, "steps of;" should read -- steps of: --.
Line 63, "comprises;" should read -- comprises: --.

Column 30,
Line 57, "every sides" should read -- every side --.

Column 31,
Line 7, "steps of;" should read -- steps of: --.
Line 29, "an best" should read -- a best --.
Line 31, "steps of;" should read -- steps of: --.

Column 32,
Line 3, "monitor pattern each group of focus monitor pattern" should read
-- monitor patterns, each group of focus monitor patterns --.
Line 20, "groups of focus monitor pattern" should read -- groups of focus monitor patterns --.
Line 22, "0 degree," should read -- 0 degrees, --.

Signed and Sealed this

Twentieth Day of May, 2003

JAMES E. ROGAN
*Director of the United States Patent and Trademark Office*